(12) United States Patent
Son et al.

(10) Patent No.: US 7,772,108 B2
(45) Date of Patent: *Aug. 10, 2010

(54) INTERCONNECTION STRUCTURES FOR SEMICONDUCTOR DEVICES AND METHODS OF FORMING THE SAME

(75) Inventors: Suk-Joon Son, Gyeonggi-do (KR); Jong-Ho Park, Seoul (KR); Hyun-Suk Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

This patent is subject to a terminal disclaimer.

(21) Appl. No.: 11/541,027

(22) Filed: Sep. 29, 2006

(65) Prior Publication Data
US 2007/0093050 A1 Apr. 26, 2007

Related U.S. Application Data

(63) Continuation-in-part of application No. 11/022,240, filed on Dec. 22, 2004.

(30) Foreign Application Priority Data

Jun. 25, 2004 (KR) .................. 10-2004-0048119
Sep. 30, 2005 (KR) .................. 10-2005-0092328

(51) Int. Cl.
*H01L 21/4763* (2006.01)
(52) U.S. Cl. ............... 438/618; 438/675; 257/E21.006; 257/E21.221; 257/E21.278; 257/E21.293; 257/E21.304; 257/E21.585
(58) Field of Classification Search .................. 438/618, 438/257, 258, 636, 675, 685, 687, 688, 692, 438/724, 725, 743, 744, 755, 756, 733; 257/E21.006, 257/221, 278, 293, 304, 585
See application file for complete search history.

(56) References Cited

U.S. PATENT DOCUMENTS 6,083,824 A 7/2000 Tsai et al.

(Continued)

FOREIGN PATENT DOCUMENTS

JP 11-054724 2/1999

(Continued)

OTHER PUBLICATIONS

"Translation of an Office Action issued by the German Patent and Trademark Office," issued Jan. 4, 2007.

(Continued)

*Primary Examiner*—David Nhu
(74) *Attorney, Agent, or Firm*—Myers Bigel Sibley & Sajovec, P.A.

(57) ABSTRACT

An interconnection structure includes an inter-level insulation layer disposed on a semiconductor substrate. First contact structures are formed in the inter-level insulation layer. Second contact structures are formed in the inter-level insulation layer and are spaced apart from the first contact structures. First spacers are disposed between the first contact structures and the inter-level insulation layer. Second spacers are disposed between the second contact structures and the inter-level insulation layer. Metal interconnections are disposed on the inter-level insulation layer and connected to the first and second contact structures. The first contact structures include first and second plugs stacked in sequence, the second contact structures include the second plugs, and the first spacers include an upper spacer disposed between the second plug and the inter-level insulation layer.

12 Claims, 37 Drawing Sheets

U.S. PATENT DOCUMENTS

| | | | |
|---|---|---|---|
| 6,258,649 B1 * | 7/2001 | Nakamura et al. | 438/238 |
| 6,291,335 B1 | 9/2001 | Schnabel et al. | |
| 6,316,801 B1 * | 11/2001 | Amanuma | 257/306 |
| 6,342,416 B1 | 1/2002 | Kim et al. | |
| 6,352,916 B1 | 3/2002 | Tang et al. | |
| 6,399,438 B2 | 6/2002 | Saito et al. | |
| 6,406,968 B1 | 6/2002 | Chien et al. | |
| 6,461,911 B2 | 10/2002 | Ahn et al. | |
| 6,479,341 B1 | 11/2002 | Lu | |
| 6,479,853 B2 | 11/2002 | Chishiki | |
| 6,521,933 B2 * | 2/2003 | Miyajima et al. | 257/296 |
| 6,576,509 B1 | 6/2003 | Toyokawa et al. | |
| 6,677,230 B2 | 1/2004 | Yokoyama et al. | |
| 6,716,764 B1 | 4/2004 | Girard et al. | |
| 6,734,065 B2 | 5/2004 | Yim et al. | |
| 6,737,357 B2 * | 5/2004 | Shimizu et al. | 438/700 |
| 6,780,707 B2 | 8/2004 | Lee | |
| 6,876,014 B2 * | 4/2005 | Kobayashi et al. | 257/202 |
| 6,972,474 B2 * | 12/2005 | Hashimoto | 257/529 |
| 2002/0149044 A1 | 10/2002 | Nakanishi et al. | |
| 2003/0087499 A1 | 5/2003 | Lane et al. | |
| 2005/0023600 A1 | 2/2005 | Shin et al. | |
| 2007/0257323 A1 * | 11/2007 | Tsui et al. | 257/382 |

FOREIGN PATENT DOCUMENTS

| | | |
|---|---|---|
| JP | 11-97534 | 4/1999 |
| JP | 2002-141412 | 5/2002 |
| KR | 10-0292943 B1 | 3/2001 |
| KR | 10-2001-0298283 | 5/2001 |
| KR | 10-2001-0075778 | 8/2001 |
| KR | 10-2002-0041190 A | 6/2002 |
| KR | 10-2003-0032650 | 4/2003 |
| KR | 10-2004-0076300 A | 9/2004 |
| KR | 10-2006-0063129 A | 6/2006 |

OTHER PUBLICATIONS

Notice to File a Response/Amendment to the Examination Report for Korean Patent Application No. 10-2004-0048119 mailed on Feb. 21, 2006.

* cited by examiner

Fig. 19A
Fig. 19B
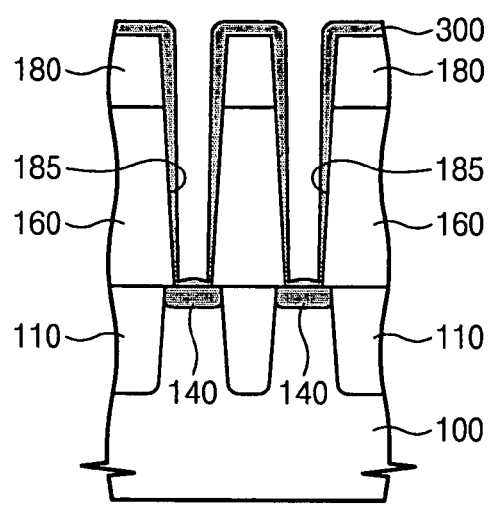
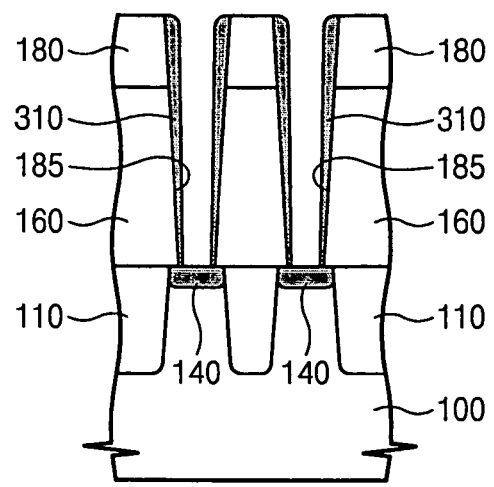

INTERCONNECTION STRUCTURES FOR SEMICONDUCTOR DEVICES AND METHODS OF FORMING THE SAME

RELATED APPLICATIONS

This application is a continuation-in-part of U.S. patent application Ser. No. 11/022,240 filed Dec. 22, 2004, which claims the benefit of and priority to Korean Patent Application No. 2004-0048119 filed Jun. 25, 2004, the disclosures of which are hereby incorporated herein by reference. This application also claims the benefit of and priority to Korean Patent Application No. 2005-92328 filed Sep. 30, 2005, the disclosure of which is hereby incorporated herein by reference.

BACKGROUND OF THE INVENTION

1. Field of the Invention

The present invention relates generally to integrated circuit devices and methods of forming the same and, more particularly, to interconnection structures for integrated circuit devices and methods of forming the same.

2. Description of the Related Art

Operating frequencies and integration densities are technical factors that may influence the cost of semiconductor devices. Device manufacturers are generally concerned with enhancing device performance and factors that affect the commercial value of the devices. As the operating frequency (or speed) is mostly affected by the resistance of interconnections connecting electrodes of transistors to each other in circuit patterns, it may be desirable to reduce the resistance of interconnections and to use techniques to improve operation and/or integration characteristics. Considering that the resistance of interconnections is dependent on the resistivity and sectional area of a material used for the interconnections, there has been proposed a technique for forming interconnections using a low-resistivity material, such as aluminum (Al) or copper (Cu). The Cu damascene process is a typical technique used to reduce interconnection resistance.

On the other hand, a shrink-down of pitches on conductive patterns, including interconnections, may be used to enhance the integration density of a semiconductor device. However, such a shrink-down in pitches of interconnections may cause the sheet resistance of the interconnections to increase. Such interconnections may use barrier metal layers to reduce the likelihood of an abnormal reaction and a diffusion of impurities.

FIG. 1 is a cross-section diagram that illustrates a conventional process for forming a semiconductor device that includes interconnection structures. In FIG. 1, a domain C1 depicts a partial section of a cell array region taken along a first direction, while a domain C2 depicts a vertical section of the domain C1 taken on a plane a.

Referring to FIG. 1, a field isolation layer 20 is formed in predetermined regions of a semiconductor substrate 10 to define active regions. The semiconductor substrate 10 may be divided into a cell array region and a peripheral region. After depositing a gate insulation layer 32 and a gate conductive layer 34 in sequence on the active regions, those layers 32 and 34 are patterned to form a gate pattern 30. From an ion implantation process with the gate pattern 30 as a mask, impurity regions 40 are provided in the active regions.

On the resultant structure where the impurity regions 40 are formed, an inter-level insulation layer 50 is deposited. The inter-level insulation layer 50 is patterned to form a first contact hole 55 partially opening the impurity regions 40 of the cell array region. The impurity regions 40 exposed by the first contact hole 55 will be connected to a bitline formed by the subsequent process. After depositing a plug conductive layer on the inter-level insulation layer 50 and filling the first contact hole 55, the plug conductive layer is etched away until the top surface of the inter-level insulation layer 50 is exposed. As a result, a contact plug 60 is formed that is connected to the impurity region 40 through the first contact hole 55. The contact plug 60 may be made of polycrystalline silicon.

A barrier metal layer 92 and a metal layer 94 are deposited on the inter-level insulation layer 50 in sequence. The metal layer 94 and the barrier metal layer 92 are patterned to form interconnecting constructions 90 connected to the contact plugs 60. During this, to prevent short circuits among the interconnecting constructions 90, the patterning process for the interconnecting constructions 90 is carried out with an over-etching technique. As a result of the over-etching, the inter-level insulation layer 50 around the interconnecting construction 90 becomes lower than the bottom of the barrier metal layer 92.

During the over-etching process, the contact plug 60 may not be etched anisotropically or removed faster than the inter-level insulation layer 50. As a result, as shown in FIG. 1, the top sides of the contact plug 60 may be etched away to result in a narrower section thereof, which causes the contact plug 60 not to be connected to the bitline 90 or to remain with high resistance.

In addition, the metal layer 94 is usually formed of aluminum, tungsten, or copper for high conductivity. But, when the metal layer 94 directly contacts the impurity regions 40 or the contact plug 60 that contains silicon, it may cause the degradation of quality due to impurity diffusion and abnormal reactions between the metal and the silicon. The barrier metal layer 92 is provided over a critical thickness tc to reduce the likelihood of such problems arising from contact between the metal and the silicon. However, the necessity for the critical thickness of the barrier metal layer 92 may reduce the ratio of an effective sectional area of the metal in the interconnecting construction 90, which may cause an abrupt increase of the sheet resistance in the interconnecting construction 90. Especially, if the minimum pitch of the interconnecting construction 90 is reduced to less than 0.1 μm, then the increase of the sheet resistance may be an important issue to address in fabricating high-frequency semiconductor devices.

Furthermore, the aspect ratio of the first contact hole 55 is increasing with an increase in the integration density of a semiconductor device. Due to this increase in the aspect ratio, the first contact hole 55 may be formed to a greater width in an upper region than in a lower region thereof, which may bring about short circuits between the contact plug 60 filling the first contact hole 55 and the interconnection structures 90.

SUMMARY

According to some embodiments of the present invention, An interconnection structure includes an inter-level insulation layer disposed on a semiconductor substrate. First contact structures are formed in the inter-level insulation layer. Second contact structures are formed in the inter-level insulation layer and are spaced apart from the first contact structures. First spacers are disposed between the first contact structures and the inter-level insulation layer. Second spacers are disposed between the second contact structures and the inter-level insulation layer. Metal interconnections are disposed on the inter-level insulation layer and connected to the first and second contact structures. The first contact structures include first and second plugs stacked in sequence, the second contact structures include the second plugs, and the first spacers include an upper spacer portion disposed between the second plug and the inter-level insulation layer.

In other embodiments of the present invention, the first spacer may further comprise a contact hole spacer including a portion interposed between the upper spacer portion and the inter-level insulation layer and a portion interposed between the inter-level insulation layer and the first plug. The first spacer may comprise silicon-nitride. Also, the second spacer may comprise the upper spacer portion of the first spacer construction.

In still other embodiments of the present invention, the semiconductor substrate may comprise a cell array region where cell transistors are arranged with cell impurity regions and cell gate patterns, a low voltage region where low voltage transistors are arranged with low voltage impurity regions and low voltage gate patterns, and a high voltage region where high voltage transistors are arranged with high voltage impurity regions and high voltage gate patterns. The cell impurity regions may be partially connected to the first contact structures, and the cell gate patterns, the low voltage gate patterns, and the high voltage gate patterns may be connected to the second contact structures.

Further, the low voltage impurity region may be connected to one of the first and second contact structures and the high voltage impurity region may be connected to one of the first and second contact structures.

In further embodiments of the present invention, a method of forming an interconnection structure for a semiconductor device includes forming an inter-level insulation layer on a semiconductor substrate. First contact holes are formed in the inter-level insulation layer. First plugs are formed in lower regions of the first contact holes. Second contact holes are formed in the inter-level insulation layer. Spacers are formed on inner sidewalls of upper regions of the first contact holes and on inner sidewalls of the second contact holes. Second plugs are formed to fill the upper regions of the first contact holes including the spacers and the second contact holes. Metal interconnections connected to the second plugs are formed on the inter-level insulation layer.

In other embodiments of the present invention, before forming the first plugs, the method may further include forming a contact hole spacer layer on the resultant structure where the first contact hole is formed; and etching the contact hole spacer layer using an anisotropic etching process until the semiconductor substrate is exposed to form a contact hole spacer on an inner sidewall of the first contact hole.

In still other embodiments of the present invention, the method may further comprise forming cell transistors having cell impurity regions and cell gate patterns, and peripheral transistors having peripheral impurity regions and peripheral gate patterns, in predetermined regions of the semiconductor substrate before forming the inter-level insulation layer. Forming the first contact holes comprises partially exposing the cell impurity regions and forming the second contact holes comprises partially exposing the cell and peripheral gate patterns.

Advantageously, embodiments of the present invention may provide an interconnection structure for a semiconductor device, which can increase the ratio of an effective sectional area of a metal layer and reduce the resistance of a contact plug and a method of forming the same.

Further, embodiments of the present invention may provide an interconnection structure of a semiconductor device that can prevent and/or reduce the occurrence of short circuits between a contact plug and metal interconnections and a method of forming the same.

BRIEF DESCRIPTION OF THE DRAWINGS

Other features of the present invention will be more readily understood from the following detailed description of specific embodiments thereof when read in conjunction with the accompanying drawings, in which:

FIGS. 19A and 19B are cross-section diagrams that illustrate a process flow for forming a contact hole spacer shown in FIGS. 18A through 18H;

DETAILED DESCRIPTION OF EMBODIMENTS OF THE INVENTION

Figure 1:
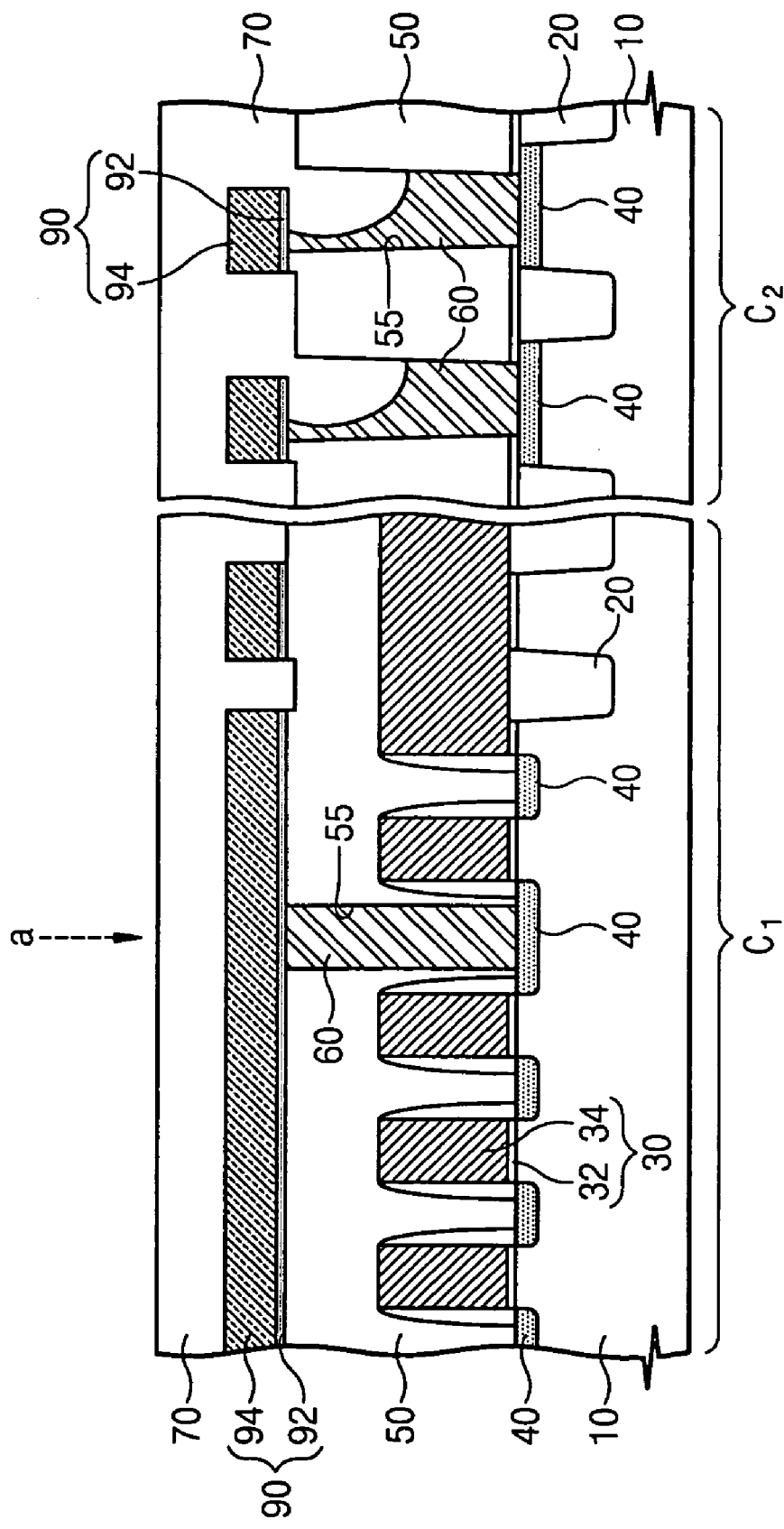
FIG. 1 is a cross-section diagram that illustrates a conventional process for forming a semiconductor device that includes interconnection structures.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures were turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 17A:
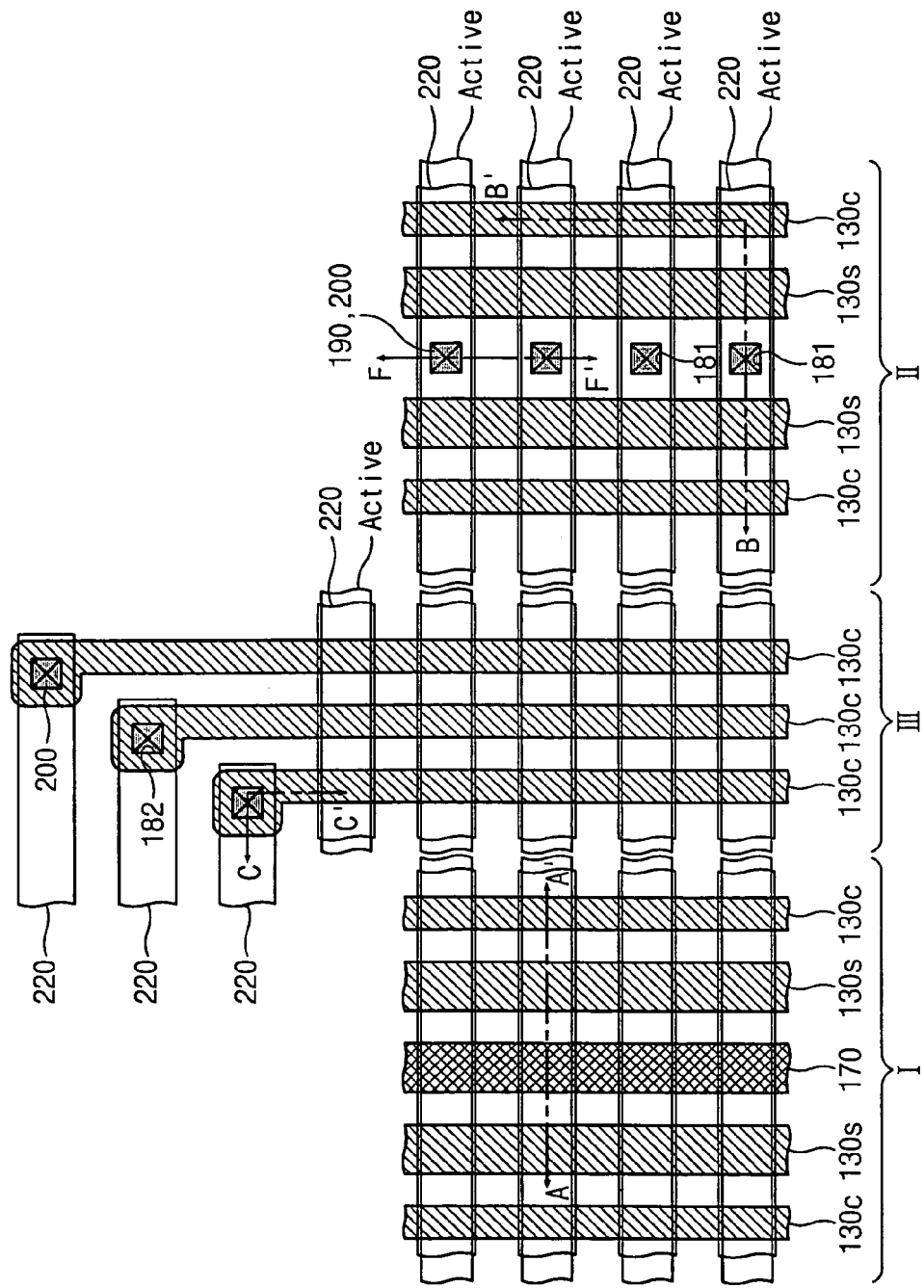
FIGS. 17A through 17C are planar diagrams of portions of a cell array region, a low voltage field, and a high voltage field of a semiconductor device according to the present invention, respectively.
Figure 17B:
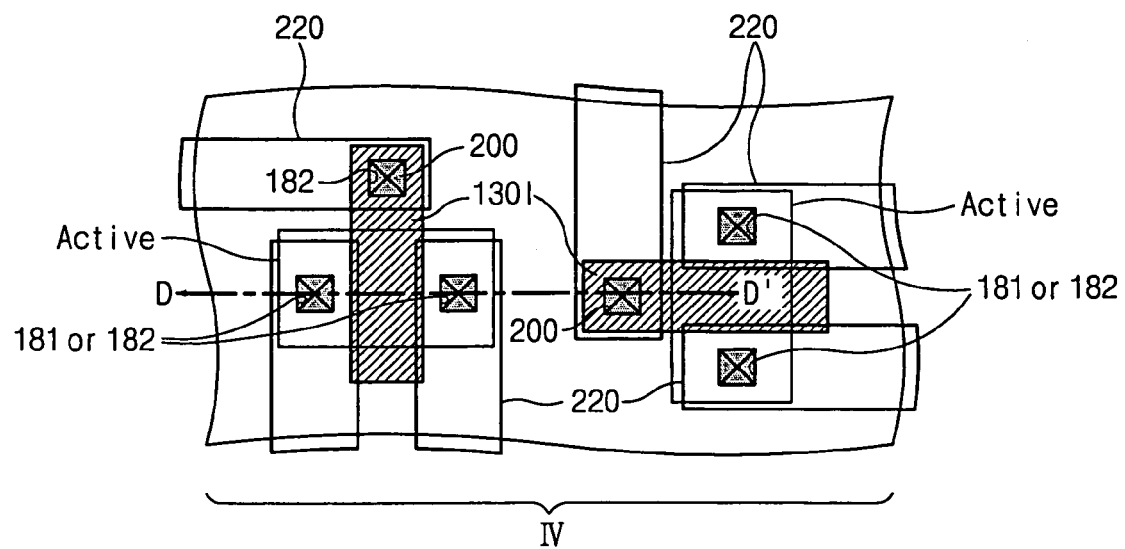
Figure 17C:
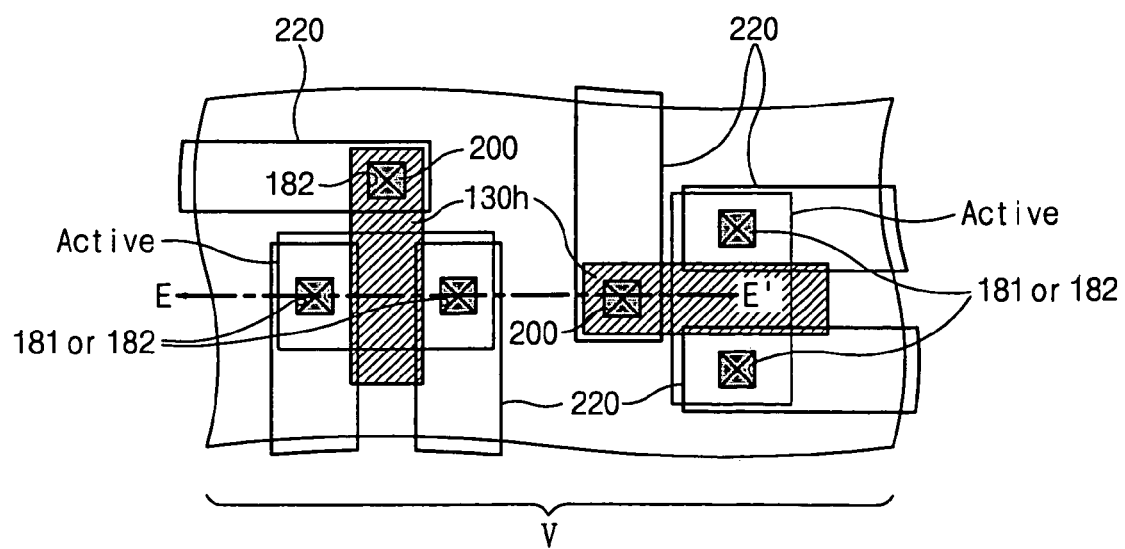
Figure 18A:
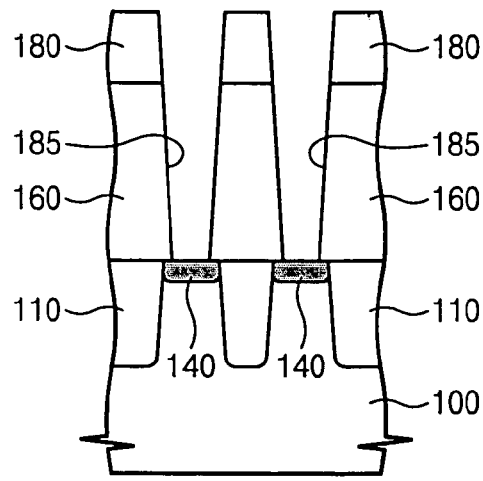
FIGS. 18A through 18H are cross-section diagrams that illustrate processing flows for manufacturing a contact plug structure according to some embodiments of the present invention.
Figure 18B:
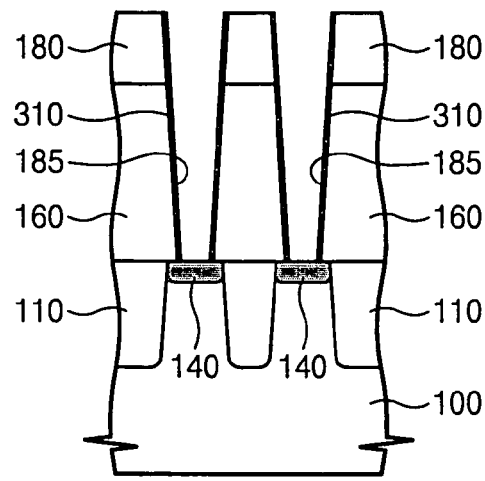
Figure 18C:
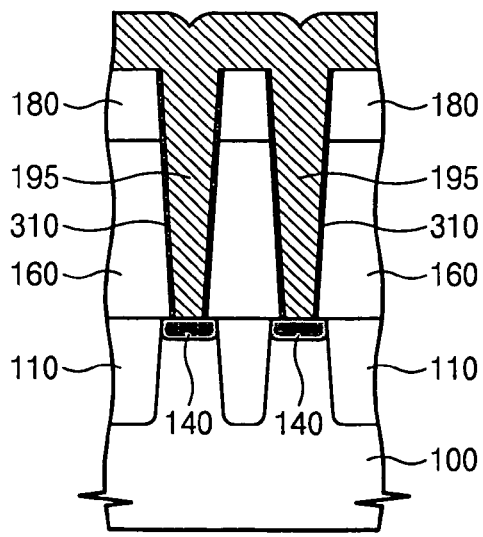
Figure 18D:
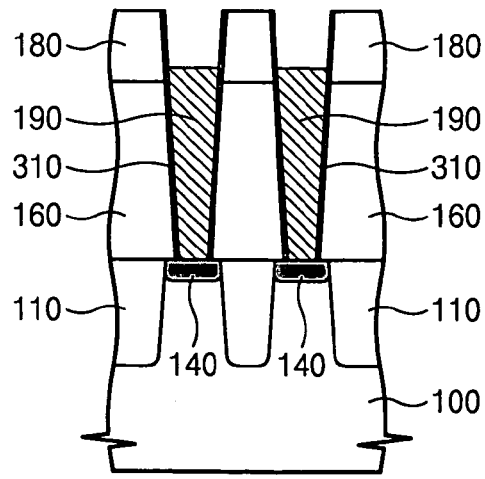
Figure 18E:
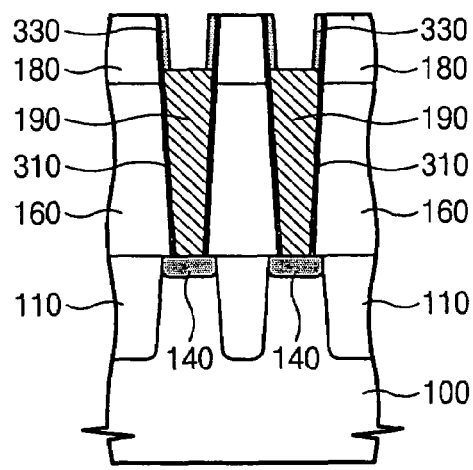
Figure 18F:
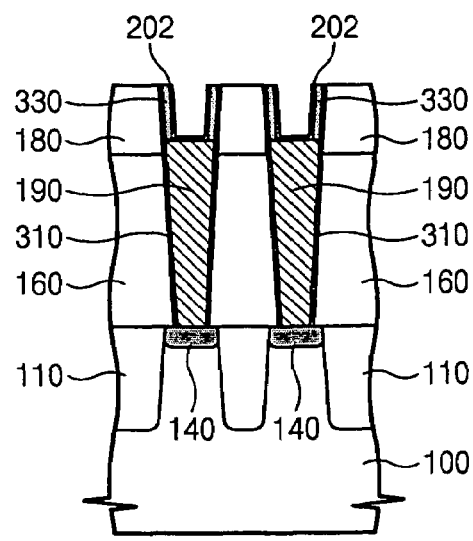
Figure 18G:
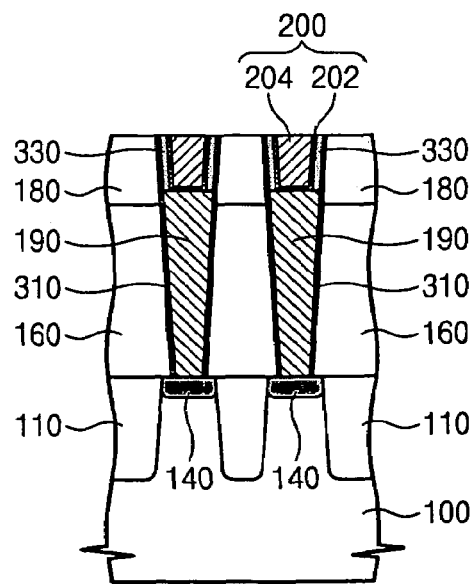
Figure 18H:
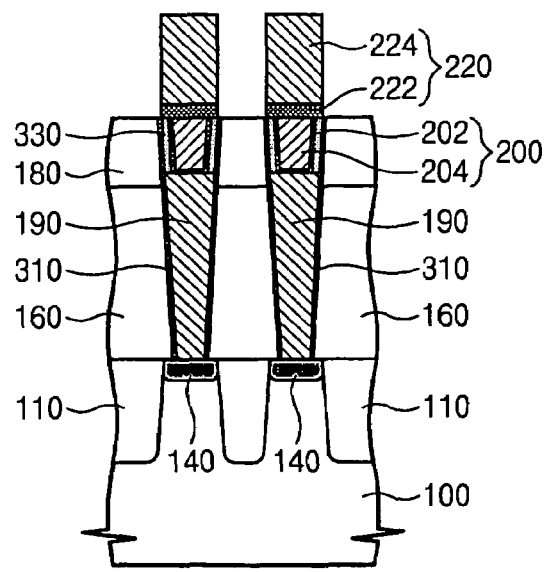
Figure 20A:
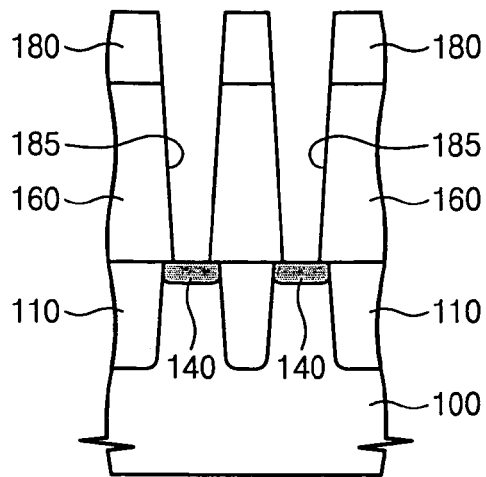
FIGS. 20A through 20H are cross-section diagrams that illustrate processing flows for manufacturing a contact plug structure according to other embodiments of the present invention.
Figure 20B:
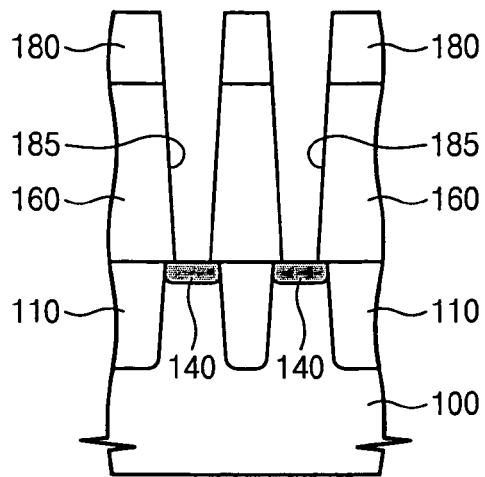
Figure 20C:
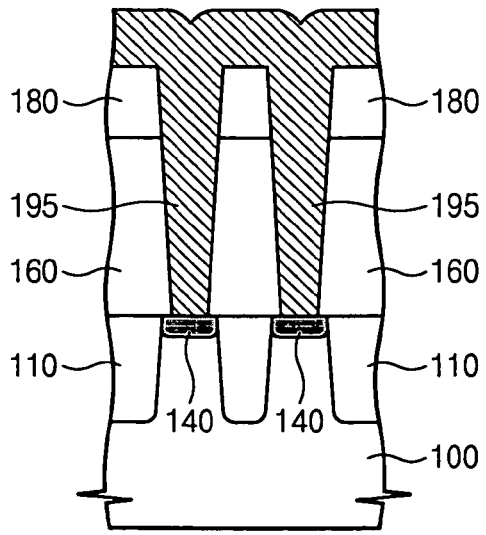
Figure 20D:
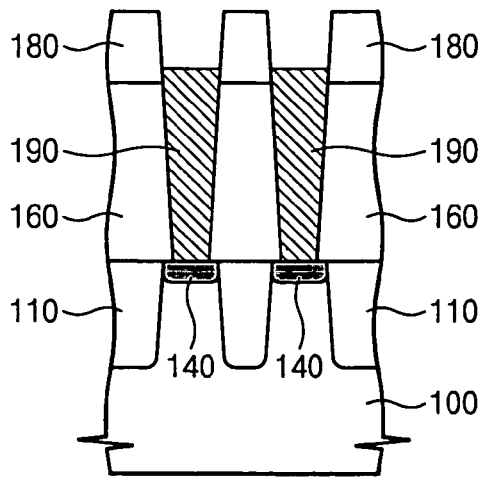
Figure 20E:
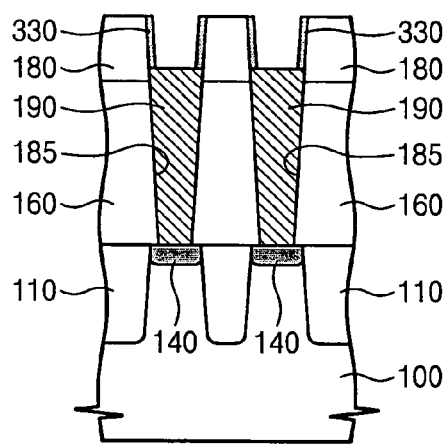
Figure 20F:
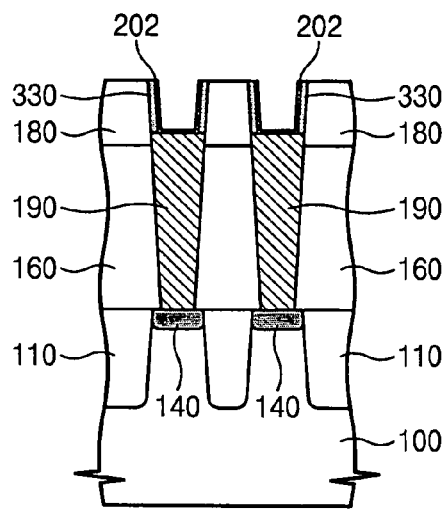
Figure 20G:
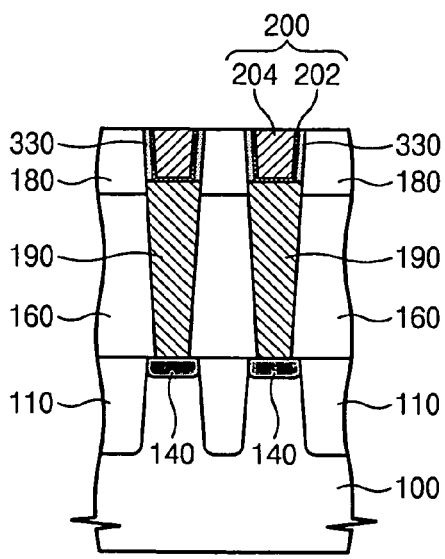
Figure 20H:
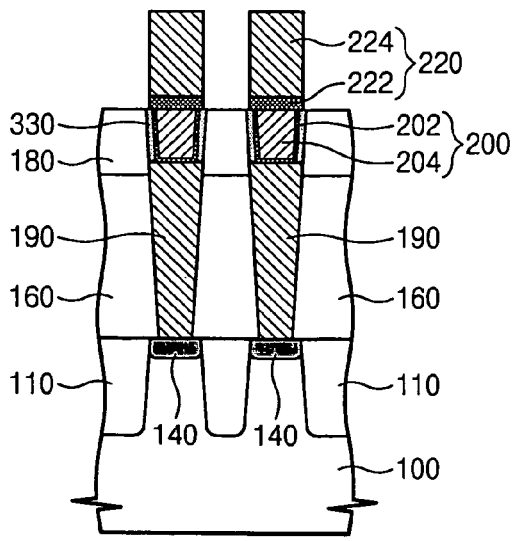

FIGS. 2A through 6B are cross-section diagrams that illustrate a processing flow for manufacturing a semiconductor device according to some embodiments of the present invention. FIGS. 7A and 7B are cross-section diagrams that illustrate a processing flow for manufacturing a semiconductor device according to further embodiments of the present invention. FIGS. 8 through 11, FIG. 12, FIGS. 13 through 15, and FIG. 16 are cross-section diagrams that illustrate processing flows for manufacturing a semiconductor device according to various other embodiments of the invention, respectively. FIGS. 17A through 17C are planar diagrams of portions of a cell array region, a low voltage field, and a high voltage field of a semiconductor device according to the present invention, respectively. In FIGS. 2A, 3A, 4A, 5A, 6A, and 7A, domains I, II, and III denote a common source region, a drain contact region, and a gate contact region, of a cell array region, respectively. In FIGS. 2B, 3B, 4B, 5B, 6B, and 7B, and in FIGS. 8 through 16, domains IV and V denote high and low voltage fields of a peripheral region, respectively. More specifically, in FIGS. 2A, 3A, 4A, 5A, 6A, and 7A, the domains I, II, and III are cross-sections taken along dotted lines A-A', B-B', and C-C' of FIG. 17A, respectively. In FIGS. 2B, 3B, 4B, 5B, 6B, and 7B and in FIGS. 8 through 16, the domains IV and V are cross-sections taken along dotted lines D-D' and E-E' of FIGS. 17B and 17C, respectively.

Figure 2A:
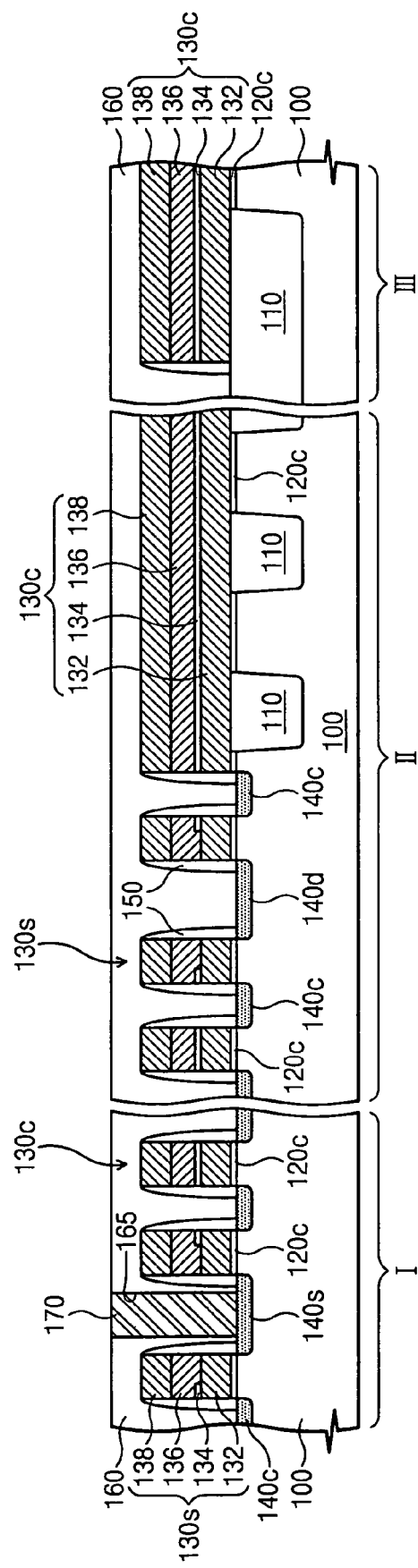
FIGS. 2A through 6B are cross-section diagrams that illustrate a processing flow for manufacturing a semiconductor device according to some embodiments of the present invention.
Figure 2B:
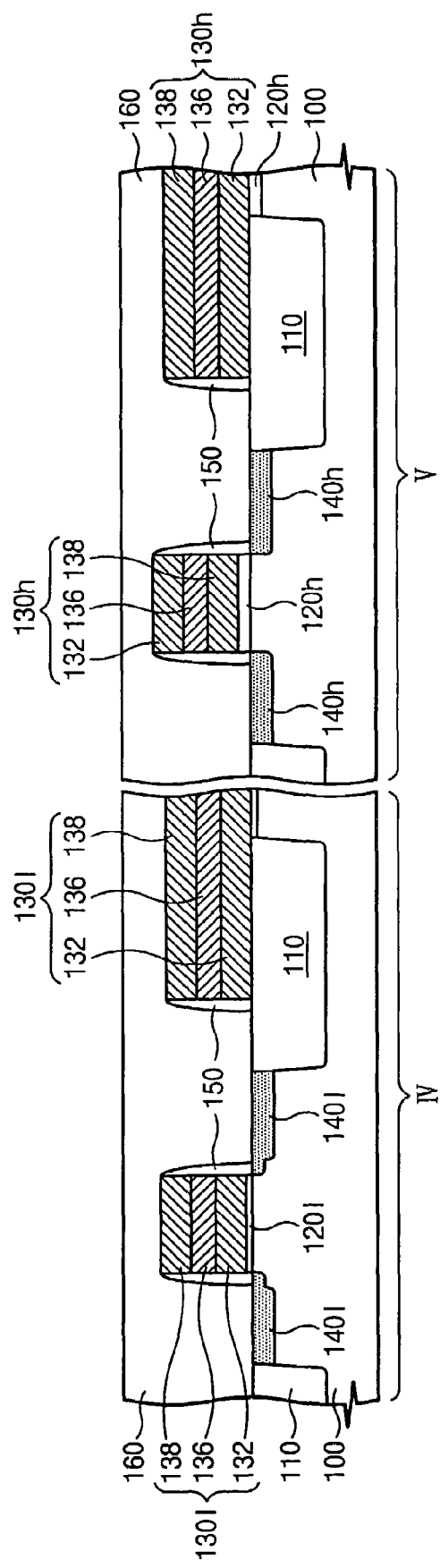

Referring to FIGS. 2A and 2B, a semiconductor substrate 100 comprising a cell array region and a peripheral region is prepared, and a field isolation region 110 is formed to define active regions in predetermined positions in the semiconductor substrate 100. The cell array region comprises the common source region I, the drain contact region II, and the gate contact region III, while the peripheral region comprises the low voltage field IV and the high voltage field V. Subsequently, a cell gate insulation layer 120c, a low-voltage (LV) gate insulation layer 120l, and a high-voltage (HV) gate insulation layer 120h are formed on the active regions of the cell array region, the low voltage field IV, and the high voltage field V, respectively. The HV gate insulation layer 120h may be thicker than the cell gate insulation layer 120c and the LV gate insulation layer 120l.

A gate patterning process forms cell gate patterns 130c, LV gate patterns 130l, and HV gate patterns 130h that cross over the active regions and the field isolation layer 110 in the LV field IV and the HV field V. The cell gate pattern 130c comprises a floating gate electrode 132, a gate inter-level insulation layer 134, and a control gate electrode (136, 138) that are stacked in sequence. The control gate electrode comprises a lower control gate electrode 136 and a higher control gate electrode 138. The floating gate electrode 132 and the lower control gate electrode 136 may comprise polycrystalline silicon, while the gate inter-level insulation layer 134 may comprise a compound of silicon-oxide, silicon-nitride, and silicon-oxide. The higher control gate electrode 138 comprises a low-resistance conductive material, such as tungsten-silicide or tungsten.

During formation of the cell gate pattern 130c, the gate inter-level insulation layer 134 is removed in the LV and HV fields IV and V. Thus, the LV and HV gate patterns, 130l and 130h, are each formed of the floating gate electrode 132, the lower control gate electrode 136, and the higher control gate electrode 138. The gate inter-level insulation layer 134 may be partially removed at predetermined positions in the cell array region. As a result, in the predetermined positions of the cell array region, a selection gate pattern 130s contacts the lower control gate electrode 136 directly with the floating gate electrode 132.

Next, an ion implantation process is carried out to form cell impurity regions 140c, LV impurity regions 140l, and HV impurity regions 140h in the active regions of the cell array region and the LV and HV fields IV and V, respectively. The cell impurity regions 140c include source impurity regions 140s and drain impurity regions 140d in the active regions between the patterns of the selection gate patterns 130s. The ion implantation process may be carried out with a mask using the pattern of the gate patterns 130 or the pattern of gate spacers 150 formed on both sidewalls of the gate patterns 130. Therefore, the impurity regions 140 may have different positions with respect to each other in the cell array region.

On the resultant structure in which the impurity regions 140 are completed, a lower insulation layer 160 is deposited. The lower insulation layer 160 may comprise silicon-oxide. The lower insulation layer 160 is patterned to form common source trenches 165 that expose the source impurity regions 140s. The common source trenches 165 are filled with a common source line layer 170 that connects the source impurity regions 140s. The common source line layer 170 may comprise tungsten.

Figure 3A:
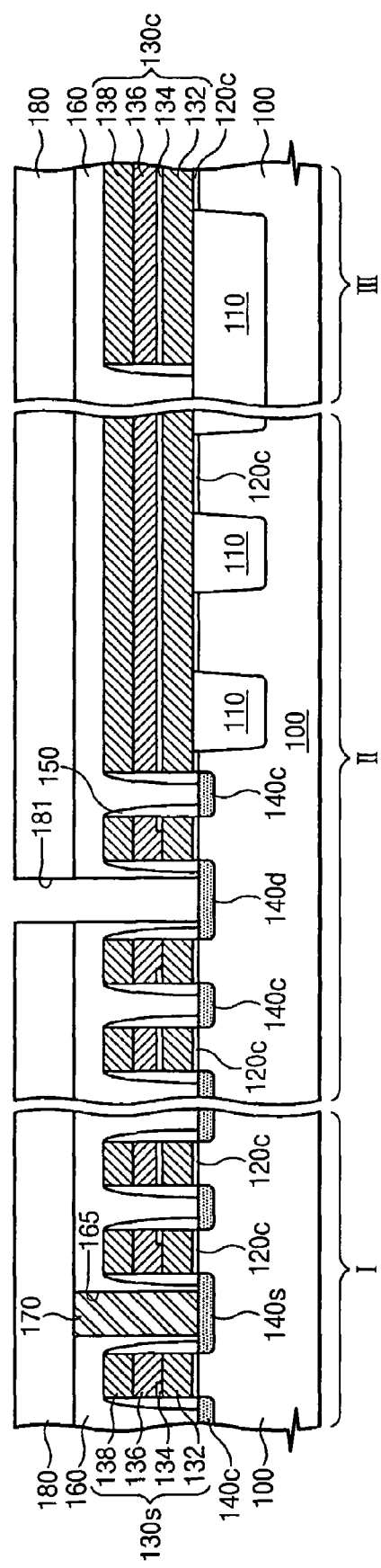
Figure 3B:
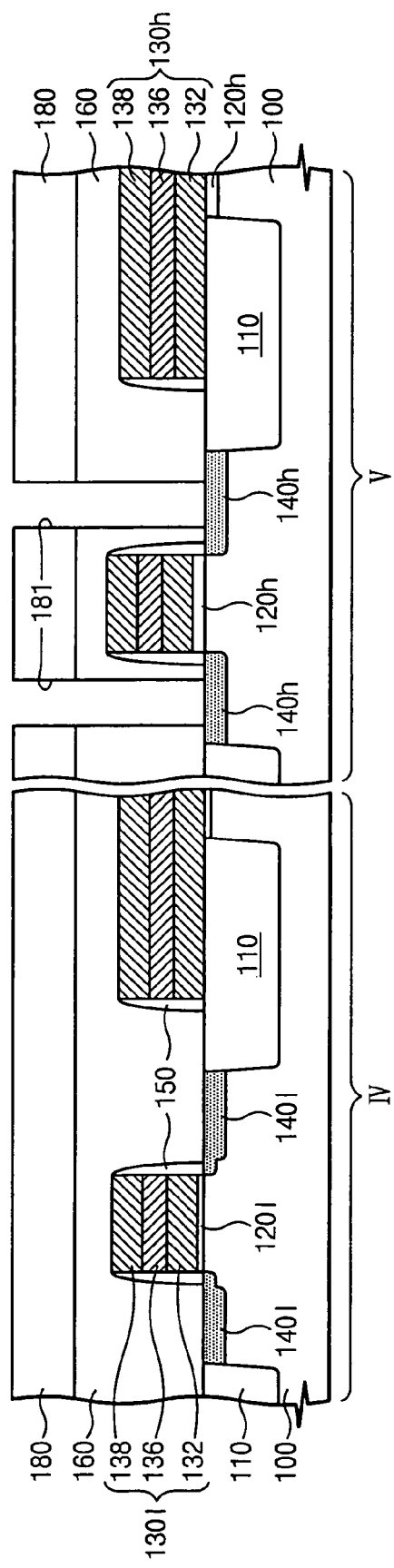

Referring to FIGS. 3A and 3B, a higher insulation layer 180 is formed in the resultant structure with the common source line layer 170. The higher and lower insulation layers, 180 and 160, constitute an inter-level insulation layer. The higher insulation layer 180 may comprise silicon-oxide, silicon-nitride, silicon-oxynitride, and/or porous insulation materials.

In some embodiments of the invention, the higher and lower insulation layers, 180 and 160, are sequentially patterned to form first contact holes 181 that expose the drain impurity regions 140d and the HV impurity regions 140h. The process for providing the first contact holes 181 may be implemented using an anisotropic etching technique incorporating an etch recipe having an etch selectivity against silicon. The lower insulation layer 160 may comprise silicon-nitride and silicon-oxide that are deposited in sequence, where the silicon-nitride is used as an etch stop layer for shaping the first contact holes 181.

Figure 8:
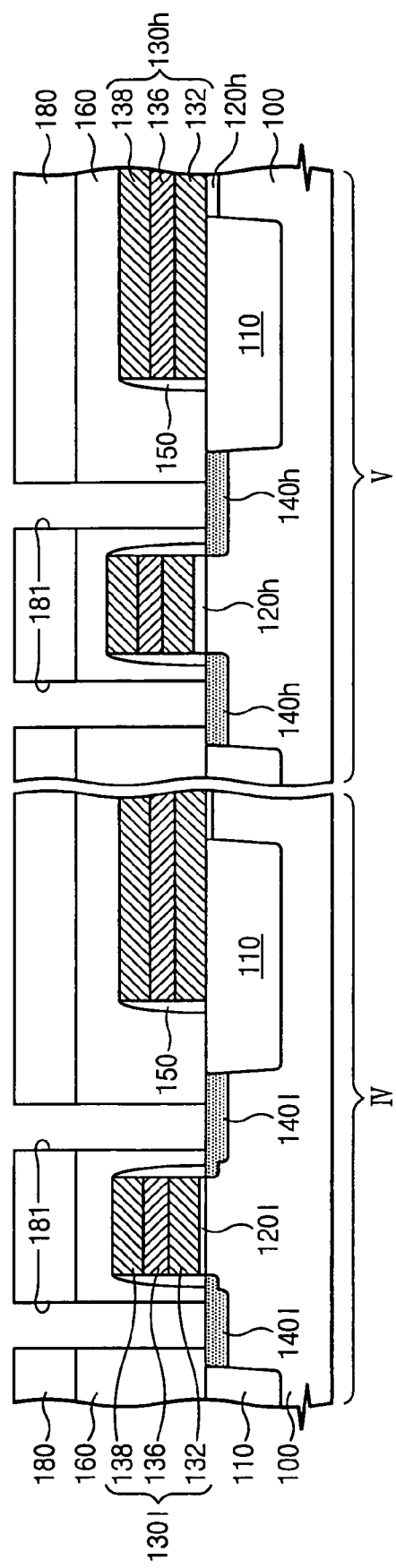
FIGS. 8 through 11, FIG. 12, FIGS. 13 through 15, and FIG. 16 are cross-section diagrams that illustrate processing flows for manufacturing a semiconductor device according to various other embodiments of the invention, respectively.
Figure 9:
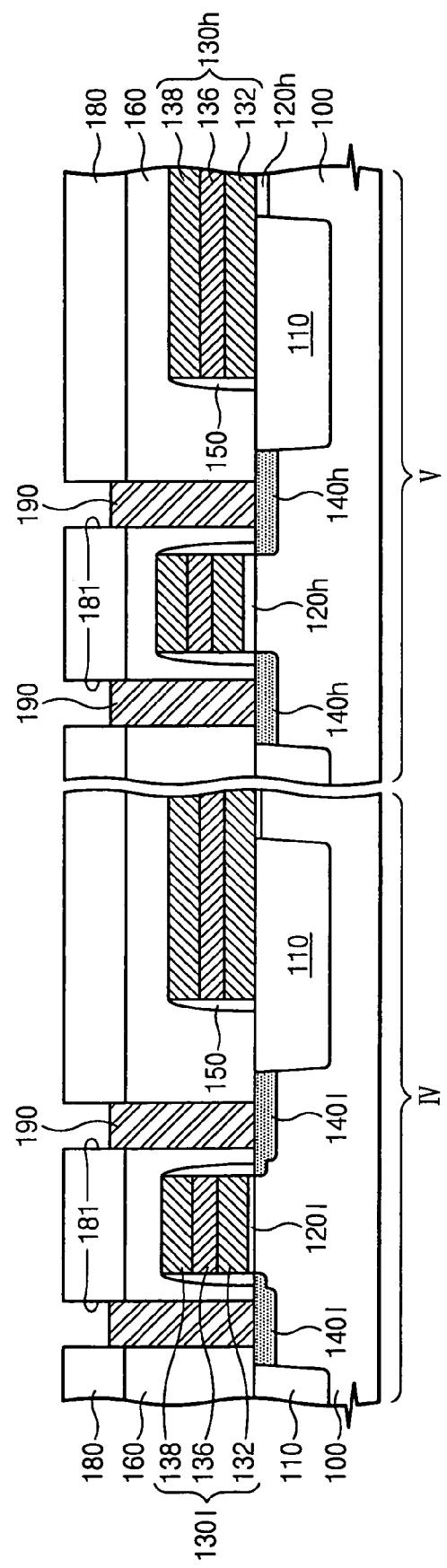
Figure 10:
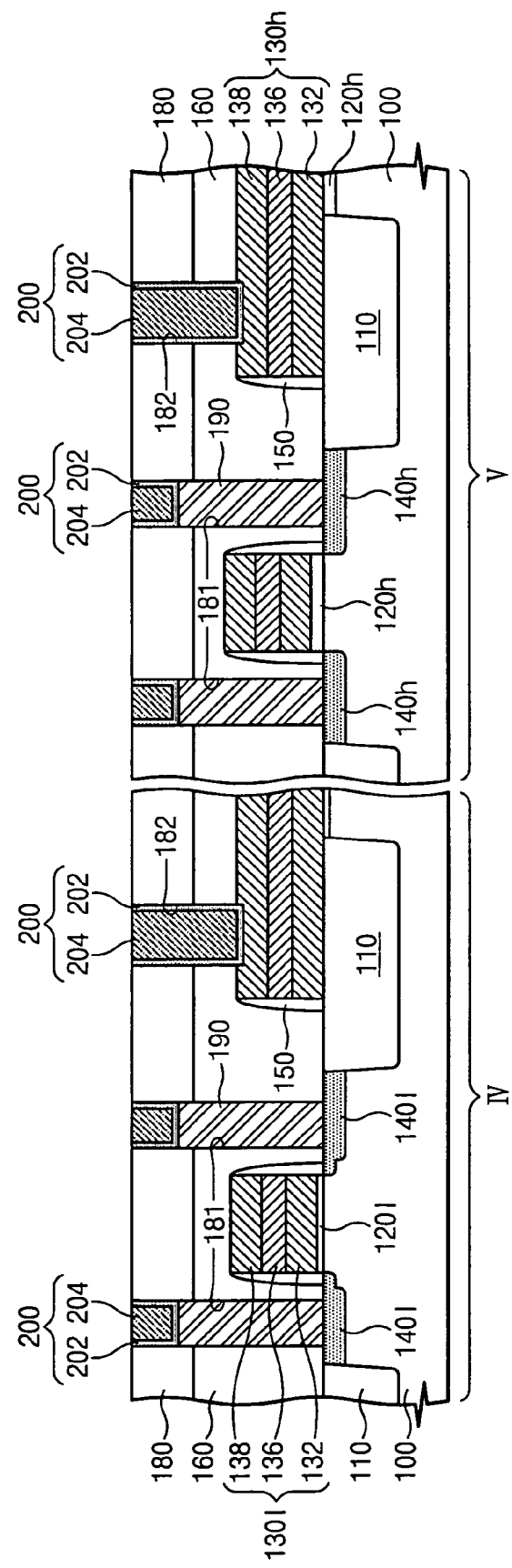
Figure 11:
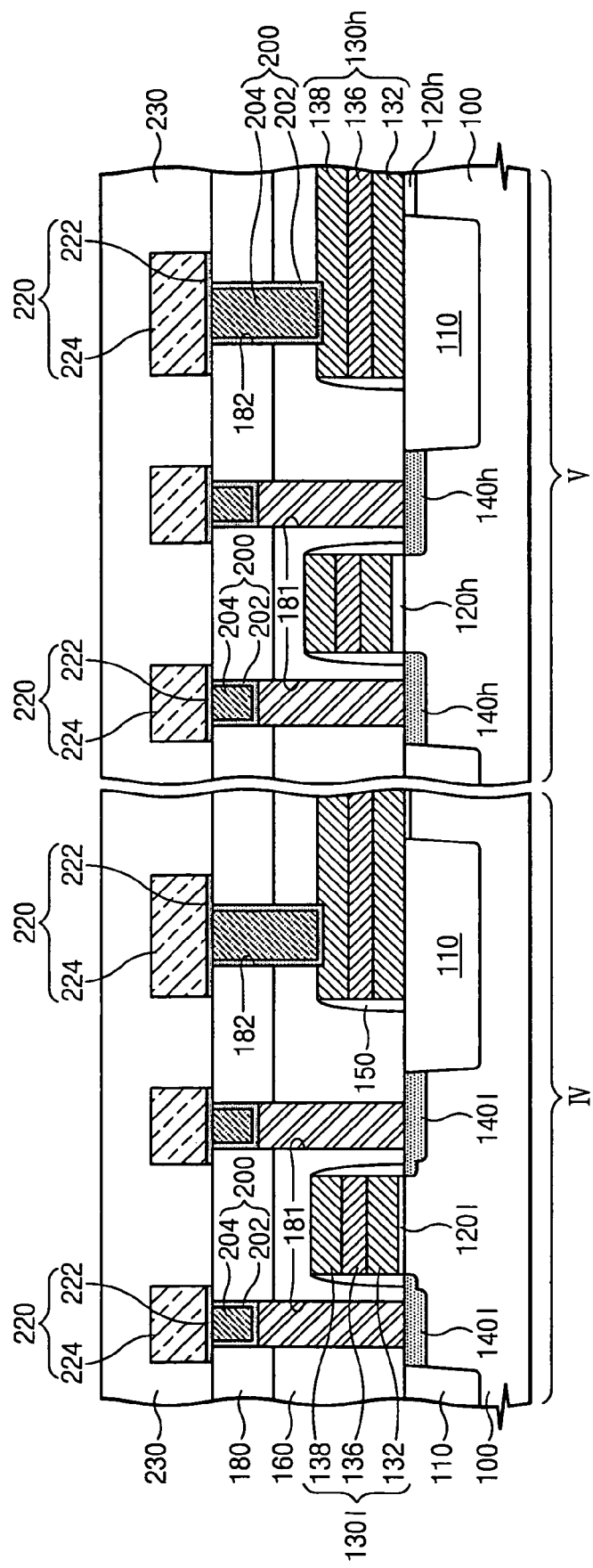
Figure 12:
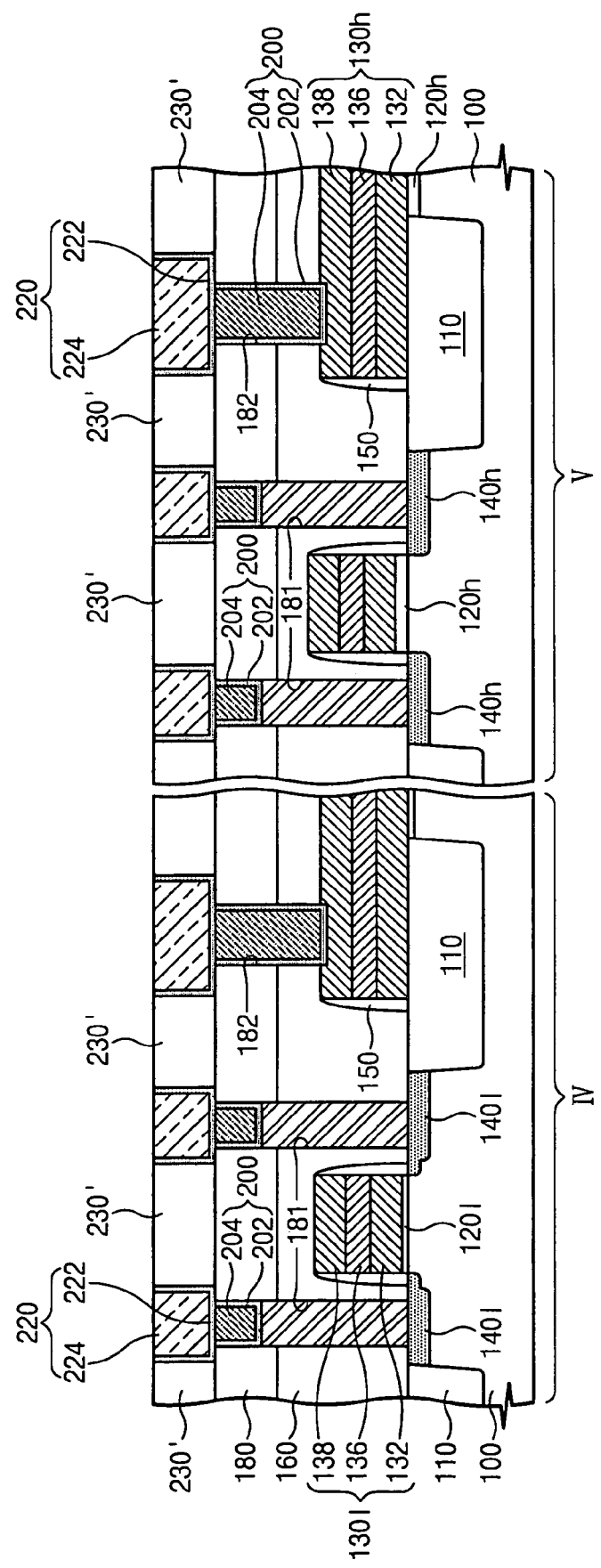
Figure 13:
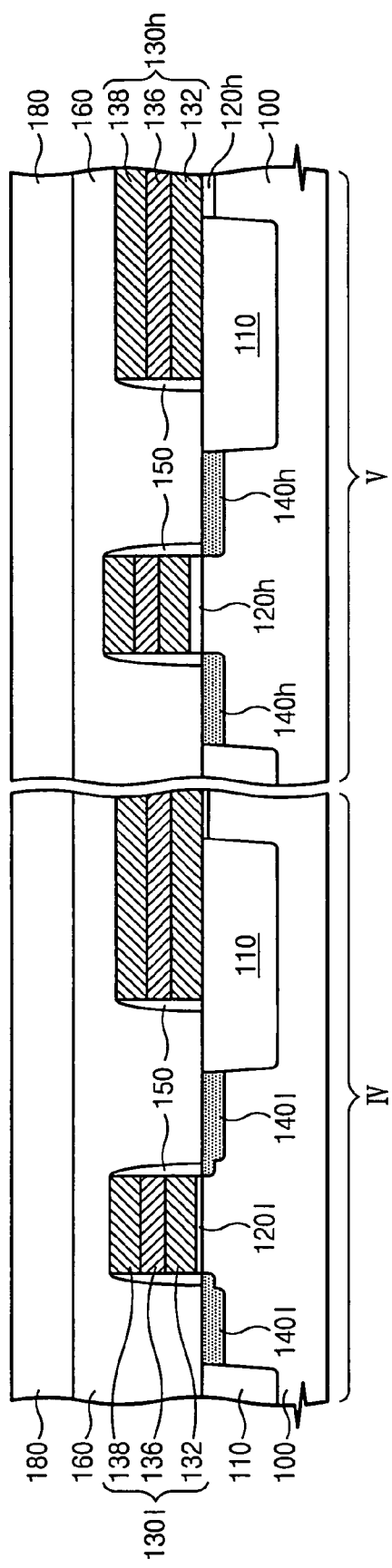
Figure 14:
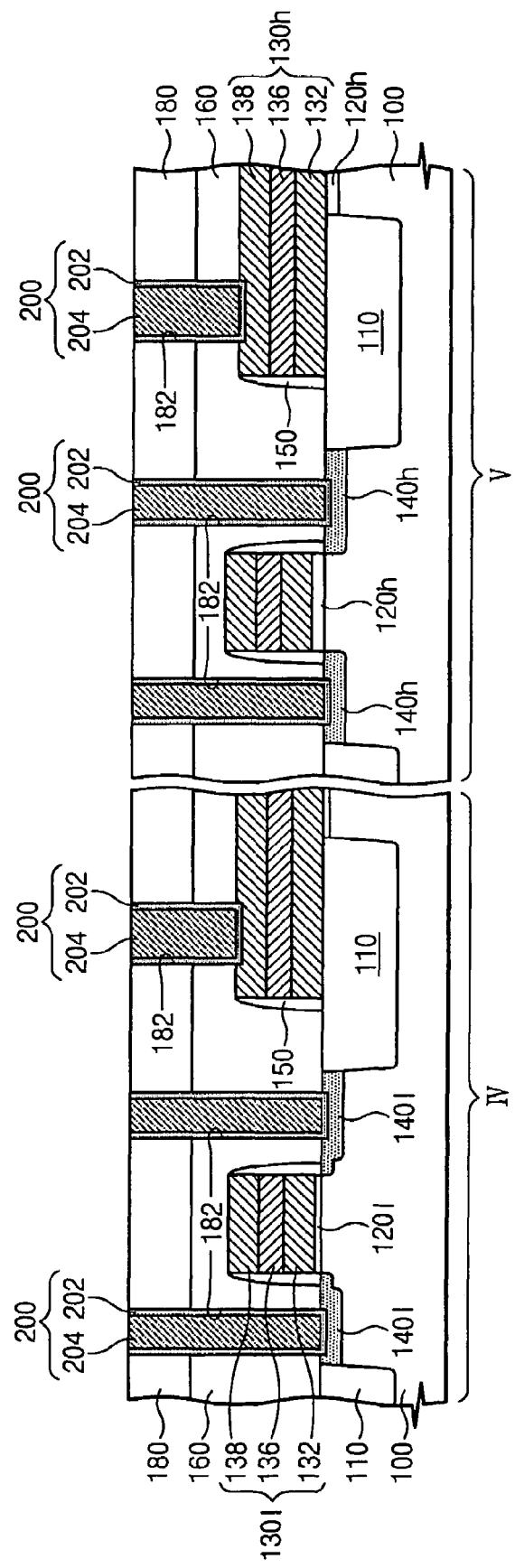
Figure 15:
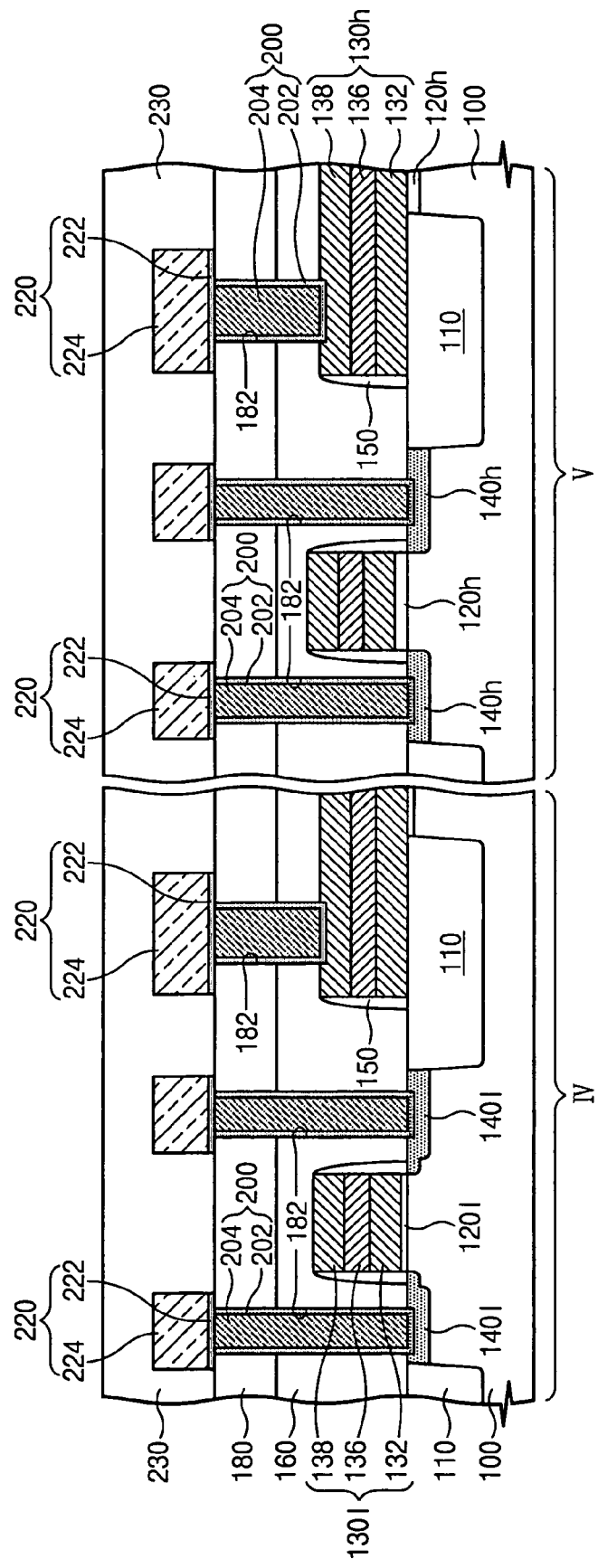
Figure 16:
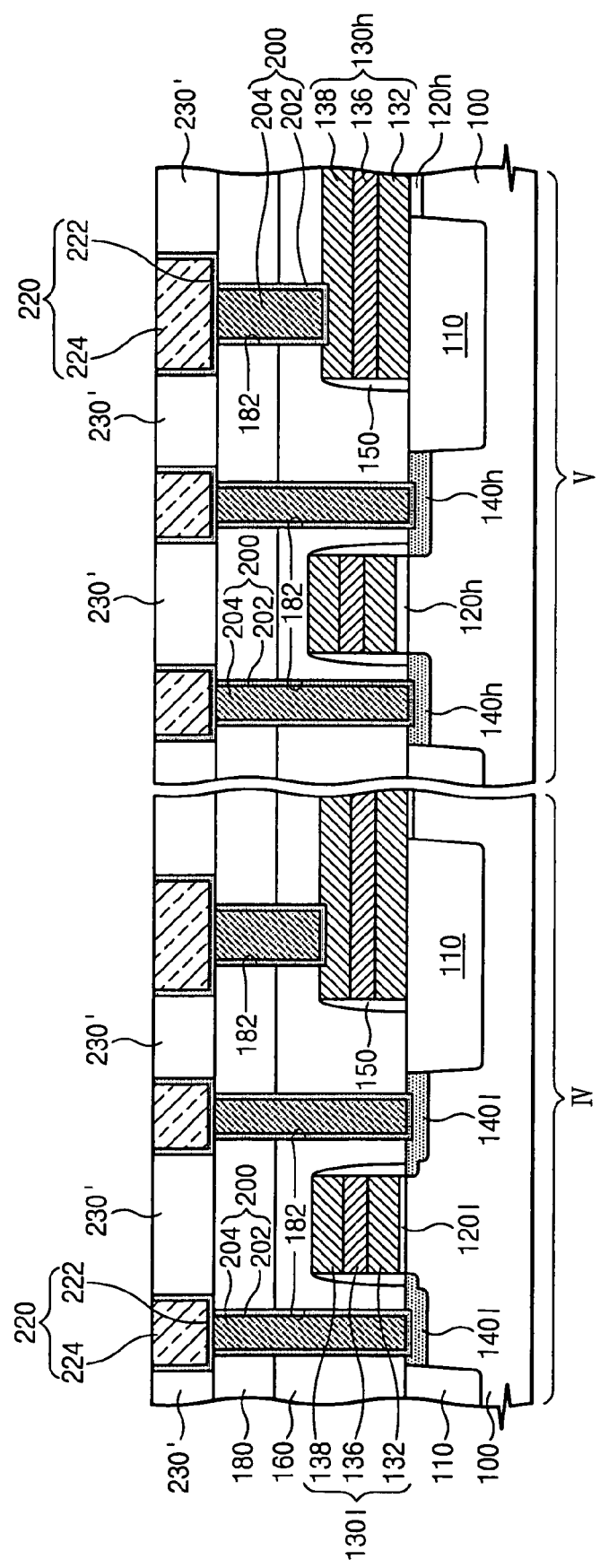

In other embodiments of the invention, the first contact holes 181 expose the drain impurity regions 140d, the HV impurity regions 140h, and the low voltage impurity regions 140l (refer to FIGS. 3A and 8).

In still other embodiments of the invention, the first contact holes 181 are confined within the cell array region. In other words, the first contact holes 181 expose only the drain impurity regions 140d, without being formed in the peripheral region (see FIGS. 3A and 13).

Figure 4A:
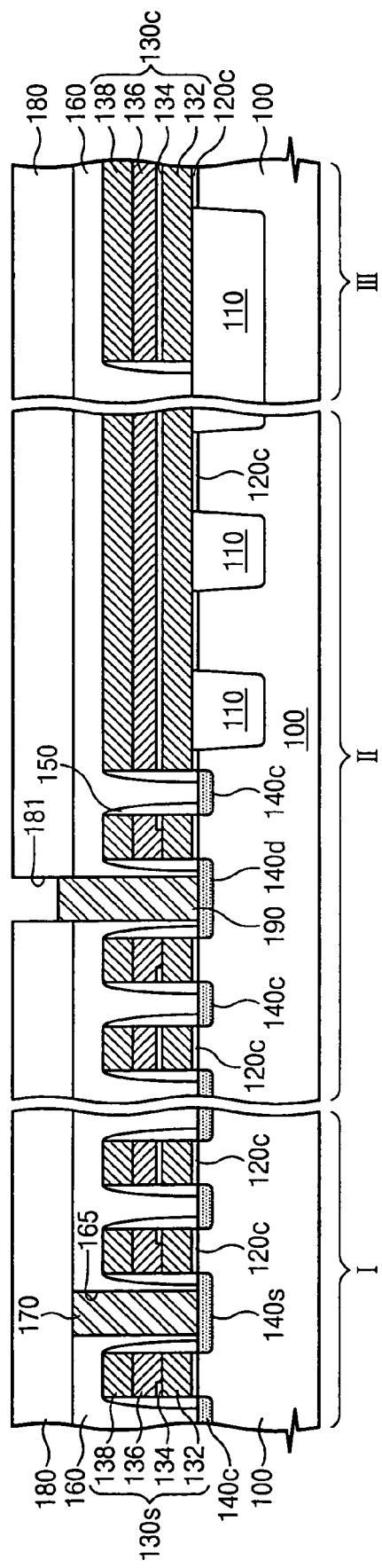
Figure 4B:
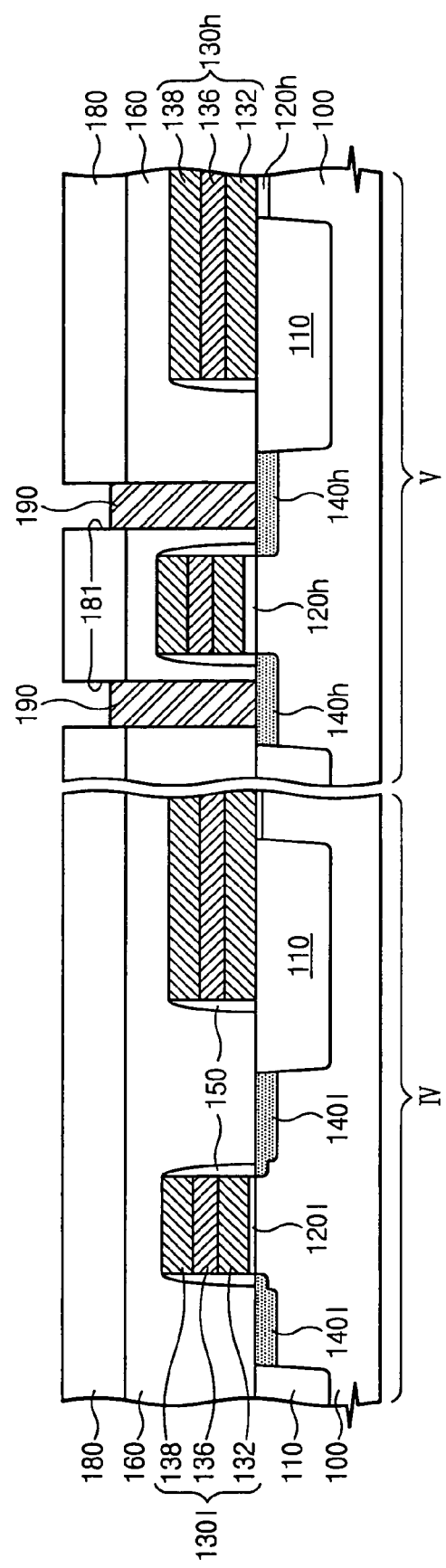

Referring to FIGS. 4A and 4B, a first conductive layer is deposited on the higher insulation layer 180 filling the first contact holes 181. The first conductive layer may comprise polycrystalline silicon. The first conductive layer is then etched away to expose the top surface of the higher insulation layer 180. The first conductive layer may be etched by means of a chemical and mechanical polishing (CMP) process. As a result, the first contact holes 181 are filled with the first contact layer on the same level of the higher insulation layer 180. Next, the top surface of the first conductive layer is further etched away to be lower than that of the higher insulation layer 180. As a result, first plugs 190 fill the first contact holes 181 but are at a lower level than the higher insulation layer 180. The top surfaces of the first plugs 190 may be leveled higher than that of the lower insulation layer 160.

In some embodiments of the invention, the first plugs 190 are connected to the drain impurity regions 140d and the HV impurity regions 140h. In other embodiments of the invention, the first plugs 190 are connected to the drain impurity regions 140d, the HV impurity regions 140h, and the LV impurity regions 140l (see FIGS. 4A and 9). In still other embodiments of the invention, the first plugs 190 are connected only to the drain impurity regions 140d (see FIGS. 4A and 13).

Figure 5A:
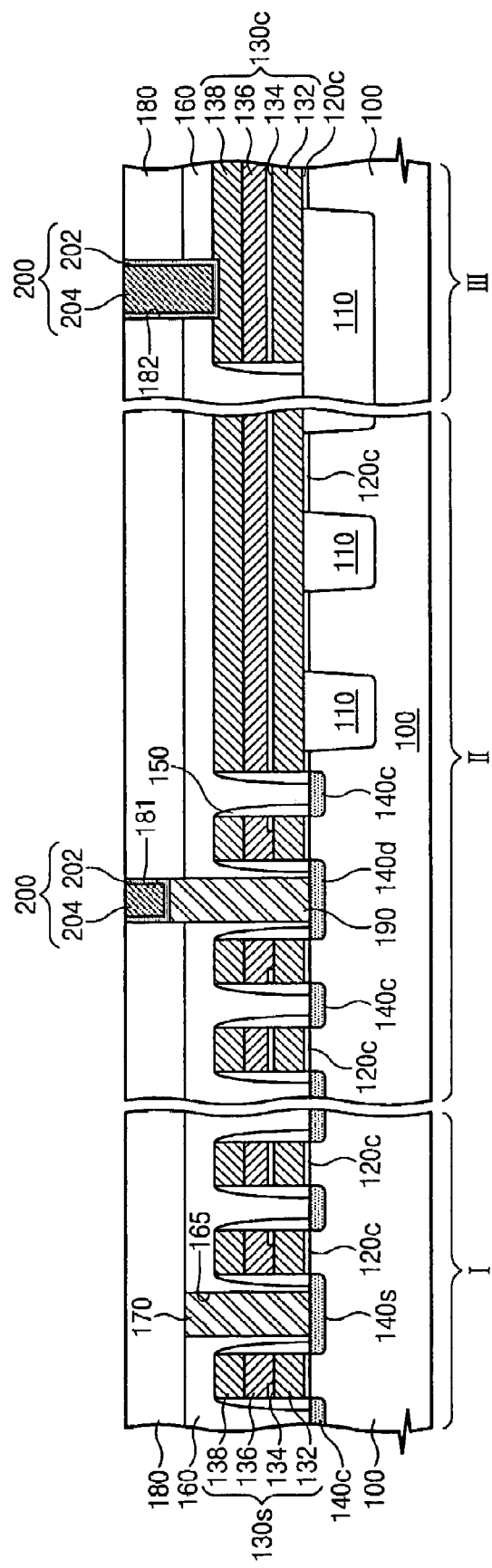
Figure 5B:
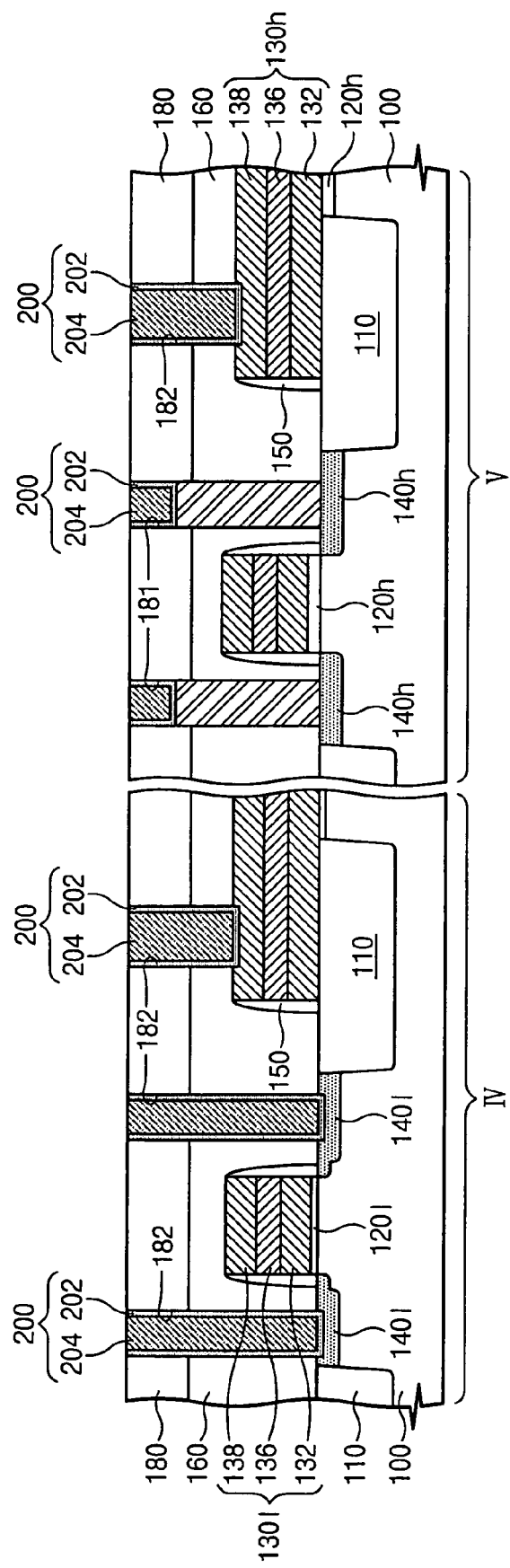

Referring to FIGS. 5A and 5B, the higher and lower insulation layers 180 and 160 are subsequently patterned to form second contact holes 182 partially exposing the top surfaces of the cell gate patterns 130c, the LV gate patterns 130l, and the HV gate patterns 130h.

The process of forming the second contact holes 182 is carried out by anisotropically etching the higher and lower insulation layers, 180 and 160, in sequence with an etch mask pattern (not shown) laid on the higher insulation layer 180. The anisotropic etching process for the second contact holes 182 may include a first operation that includes an etch recipe capable of etching a silicon-oxide with the etch selectivity against silicon-nitride, and a second operation that involves the use of an etch recipe capable of etching a silicon-nitride with the etch selectivity against the higher control gate electrode 138. During this, the silicon-nitride forming the lower insulation layer 160 acts as an etch stop in the first operation of the anisotropic etching process for the second contact holes 182.

The etch mask pattern has openings that expose the higher insulation layer 180 over the cell gate patterns 130c, the LV gate patterns 130l, and the HV gate patterns 130h. In some embodiments of the invention, the mask pattern exposes the top surface of the higher insulation layer 180 over the LV impurity regions 140l, which makes the second contact holes open over the top surfaces of the LV impurity regions 140l as shown in FIG. 5B. As discussed above, when the silicon-nitride of the lower insulation layer 160 acts as the etch stop layer, the process for shaping the second contact holes 182 may expose the LV impurity regions 140l while reducing the technical difficulty due to the difference of heights between the gate pattern and the active region. The etching operation may be carried out by means of an etch recipe capable of removing the silicon-nitride with the etch selectivity against silicon.

A second conductive layer is deposited on the resultant structure in which the second contact holes 182 are settled. The second conductive layer fills up the tops of the first contact holes 181 as well as the second contact holes 182. The second conductive layer is then planarized by etching until the top of the higher insulation layer 180 is exposed, resulting in second plugs 200. The second plugs 200 fill up the tops of the first contact holes 181 as well as the second contact holes 182. As a result, the first contact holes 181 are filled with the first and second plugs, 190 and 200, deposited in sequence, while the second contact holes 182 are filled only with the second plugs 200.

According to some embodiments of the invention, the second conductive layer comprises a first barrier metal layer 202 and a first metal layer 204 that are stacked in sequence. The first barrier metal layer 202 comprises titanium (Ti), titanium-nitride (TiN), tungsten-nitride (WN), tantalum (Ta), and/or tantalum-nitride (TaN), while the first metal layer 204 comprises tungsten (W), aluminum (Al), and/or copper (Cu). The first barrier metal layer 202 may comprise layers of titanium and titanium-nitride deposited in sequence, and the first metal layer 204 may comprise tungsten. The first barrier metal layer 202 prevents the first metal layer 204 from directly contacting the first plugs 190.

In further embodiments of the invention, the second contact holes 182 do not expose the impurity regions 140*l* and 140*h* located in the peripheral region. According to these embodiments, the second plugs 200 are connected directly to the tops of the cell gate patterns 130*c*, the LV gate patterns 130*l*, and the HV gate patterns 130*h*, and connected to the LV and HV impurity regions, 140*l* and 140*h*, through the first plugs 190 (see FIGS. 5A and 10). Normally, the second plugs 200 connected to the gate patterns 130*c*, 130*l*, and 130*h* are disposed over the filed isolation layers 110.

In still further embodiments of the invention, the second contact holes 182 expose all of the impurity regions 140*l* and 140*h* in the peripheral region. According to these embodiments, the second plugs 200 are connected directly to the tops of the gate patterns 130*c*, 130*l*, and 130*h*, the LV impurity region 140*l*, and the HV impurity region 140*h* (see FIGS. 14 and 10).

Figure 6A:
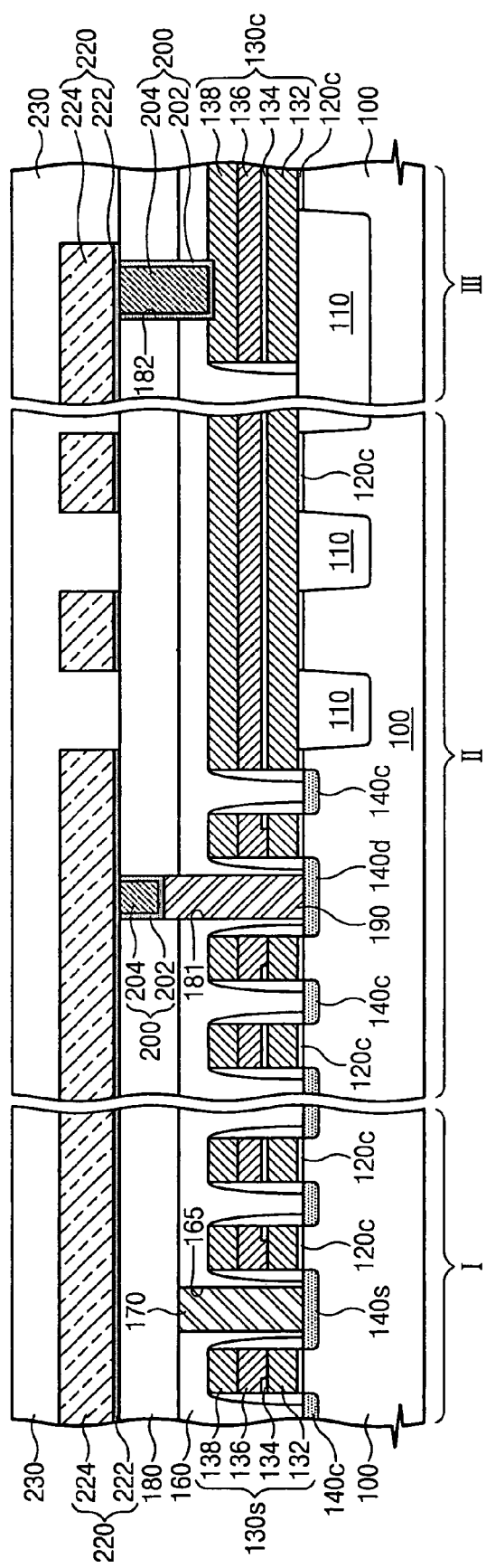
Figure 6B:
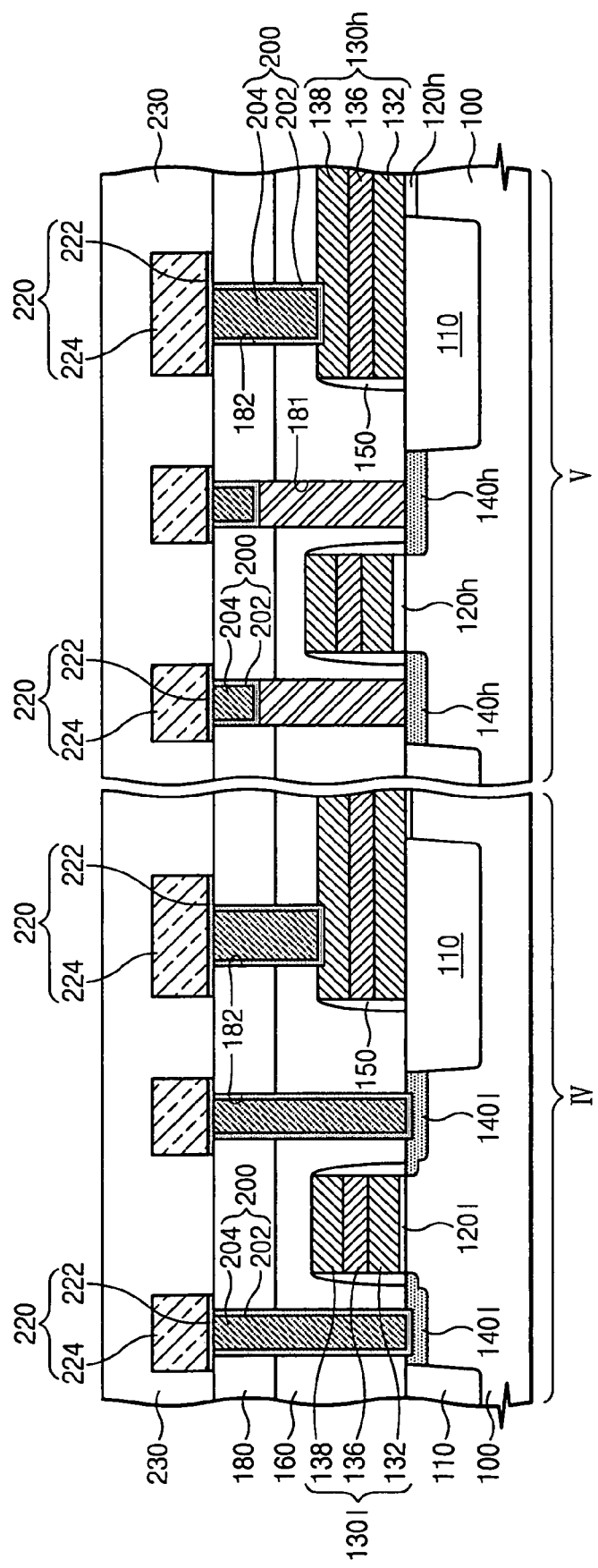
Figure 7A:
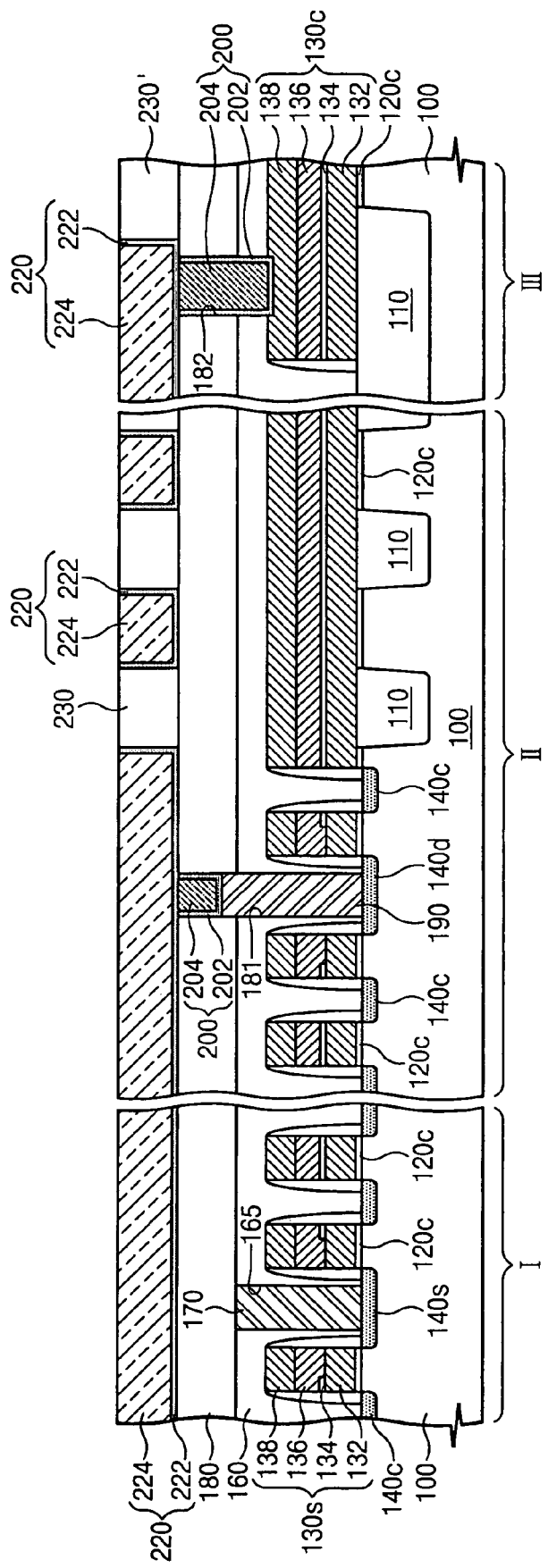
FIGS. 7A and 7B are cross-section diagrams that illustrate a processing flow for manufacturing a semiconductor device according to other embodiments of the present invention.
Figure 7B:
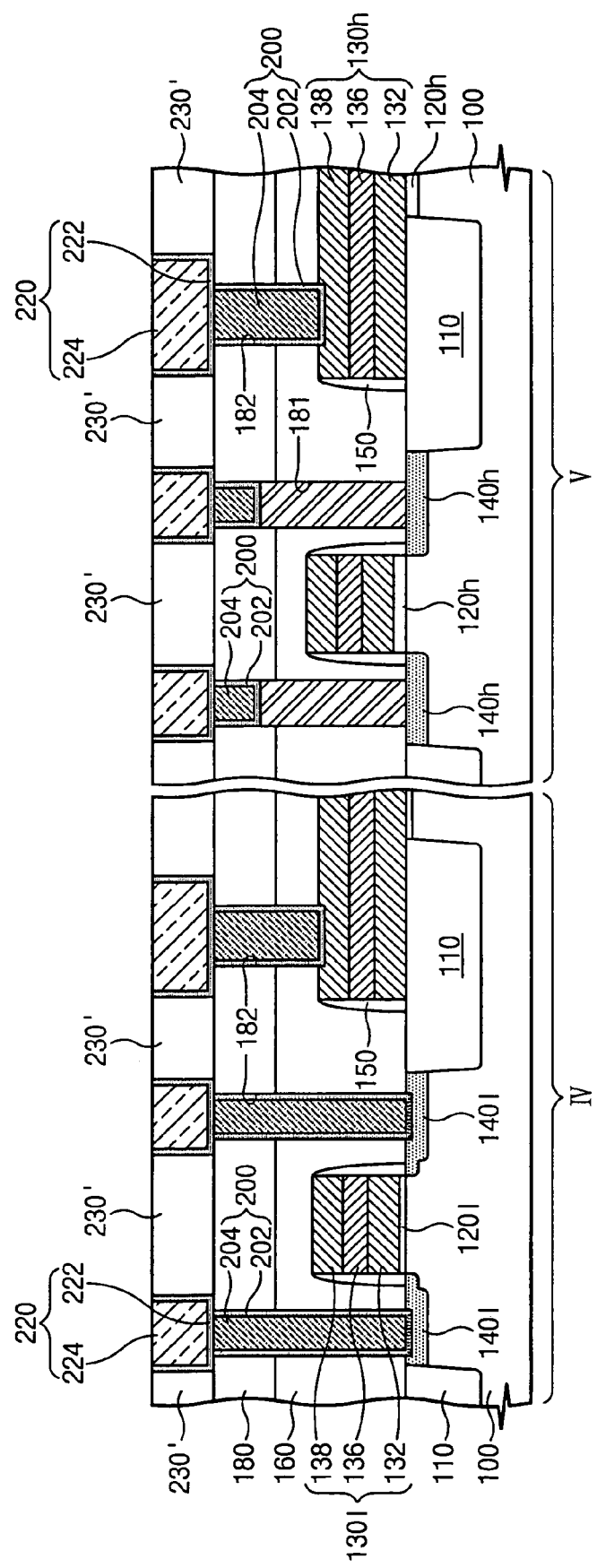

Referring to FIGS. 6A and 6B, on the resultant structure where the second plugs 200 are constructed, a third conductive layer is deposited and patterned to form metal interconnections 220 connected to the tops of the second plugs 200. An inter-metal insulation layer 230 is deposited on the structure having the metal interconnections 220.

The third conductive layer may comprise a second barrier metal layer 222 and a second metal layer 224 that are stacked in sequence. The second barrier metal layer 222 comprises titanium (Ti), titanium-nitride (TiN), tungsten-nitride (WN), tantalum (Ta), and/or tantalum-nitride (TaN), while the second metal layer 224 comprises tungsten (W), aluminum (Al), and/or copper (Cu). The second barrier metal layer 222 may comprise layers of titanium and titanium-nitride deposited in sequence, and the second metal layer 224 may comprise tungsten. The metal interconnections 220 may comprise the second metal layer 224 without the second barrier metal layer 220.

As a result, the metal interconnections 220 form bitlines that are each connected to the drain impurity regions 140*d* in the cell array region. The cell impurity regions 140*c* are each disposed between the drain impurity regions 140*d* connected to the bitlines and the source impurity regions 140*s* connected to the common source line layer 170. The patterns of the cell gate patterns 130*c* are arranged between the cell impurity regions 140*c*. The selection gate patterns 130*s* are disposed adjacent to the source impurity regions 140*s* and the drain impurity regions 140*d*.

The process of patterning the third conductive layer is carried out through anisotropic etching by means of an etch mask pattern that defines the metal interconnections 220 on the third conductive layer. Some embodiments of the invention include the process of forming the metal interconnections 220 with the patterning process (see FIGS. 6A, 6B, 11, and 15).

As stated above, the patterning process may also include an over-etching effect to prevent a short circuit between the adjacent interconnections. In the conventional case, the contact plug (60 of FIG. 1) results in a narrow section because the top sides are excessively over-etched. According to some embodiments of the invention, however, as the second plugs 200 of metal are disposed under the metal interconnections 220, the second plugs 200 are etched in an anisotropic etch mode while prosecuting the over-etch process for the metal interconnections 220. As result, problems with the conventional technique, e.g., the narrow section of the contact plug may be reduced and/or overcome.

In some embodiments of the invention, the metal interconnections 220 may be formed by means of a damascene process (refer to FIGS. 7A, 7B, 12, and 16). The damascene process is carried out by forming interconnection grooves 235 to expose the tops of the second plugs 200 after deposing and patterning a molding layer 230' on the structure having the second plugs 200. Afterwards, the third conductive layer is deposited thereon to fill the interconnection grooves 235 and is planarized by etching until the top of the molding layer 230' is exposed.

In the embodiments using such a damascene process, the third conductive layer may comprise the second barrier metal layer 222 and the second metal layer 224 that are stacked in sequence. However, according to some embodiments of the invention, because the second metal layer 224 indirectly contacts the first plugs 190, the thickness of the second metal layer 224 may be thinner than the critical thickness tc of the conventional case.

In addition, some embodiments of the present invention may not include the second barrier metal layer 222 if the second metal layer 224 is made of the same material as the first metal layer 204, or is not involved in the technical problems due to the impurities.

Returning to FIGS. 6A and 6B, the field isolation layer 110 is disposed at predetermined regions of the semiconductor substrate 100. The semiconductor substrate 100 comprises the cell array region and the peripheral regions. The cell array region comprises the common source region I, the drain contact region II, and the gate contact region IV, while the peripheral region comprises the LV region IV and the HV region V.

The cell gate insulation layer 120*c*, the LV gate insulation layer 120*l*, and the HV gate insulation layer 120*h* are formed on the LV and HV regions IV and V. The HV gate insulation layer 120*h* is usually thicker than the cell gate insulation layer 120*c* and the LV gate insulation layer 120*l*.

Further, in the cell array region, the LV region IV, and the HV region V, the patterns of the cell gate patterns 130*c*, the LV gate patterns 130*l*, and the HV gate patterns 130*h* are arranged so as to cross the tops of the active regions and the field isolation layer 110.

The cell gate pattern 130*c* comprises the floating gate electrode 132, the gate inter-level insulation layer 134, and the control gate electrode that are stacked in sequence. The control gate electrode comprises the lower and higher control gate electrodes, 136 and 138, which are deposited in sequence. The floating gate electrode 132 and the lower control gate electrode 136 comprise polycrystalline silicon and the gate inter-level insulation layer 134 may comprise silicon-oxide, silicon-nitride, and/or silicon-oxide. The higher control gate electrode 138 comprises a low-resistance conductive material (e.g., tungsten-silicide or tungsten).

On the other hand, at predetermined places in the peripheral region, the gate inter-level insulation layer 134 is partially removed to form patterns of the selection gate patterns 130*s* in which the lower control gate electrode 136 directly contacts the floating gate pattern 132. The LV and HV gate patterns, 130*l* and 130*h*, each comprise the floating gate electrode 132, the lower control gate electrode 136, and the higher control gate electrode 138.

The cell impurity regions 140*c*, the LV impurity regions 140*l*, and the HV impurity regions 140*h* are each disposed in the cell array region, the LV region IV, and the HV region V.

The cell impurity regions 140c comprise the source and drain impurity regions, 140s and 140d, in the active regions between the patterns of the selection gate patterns 130s. The impurity regions may be formed in different patterns in accordance with locations.

On the semiconductor substrate 100 having the impurity regions 140, an inter-level insulation layer 140 is formed that comprises lower and higher insulation layers 160 and 180. The lower insulation layer 160 comprises silicon-nitride and silicon-oxide stacked in sequence, while the higher insulation layer 180 comprises a silicon-oxide, a silicon-nitride, a silicon-oxynitride, and/or a porous insulation material. The lower insulation layer 160 comprises the common source line layer 170 connecting the source impurity regions 140s. The common source line layer 179 may comprise tungsten (W).

The metal interconnections 220 are laid on the higher insulation layer 180. A part of the metal interconnections 220 is connected to the drain impurity regions 140d by the first and second plugs 190 and 200 penetrating though the inter-level insulation layer. The first plug 190 may comprise polycrystalline silicon and the second plug may comprise the first barrier metal layer 202 and the first metal layer 204 that are stacked in sequence.

According to some embodiments of the invention, the first barrier metal layer 202 comprises titanium (Ti), titanium-nitride (TiN), tungsten-nitride (WN), tantalum (Ta), and/or tantalum-nitride (TaN), while the first metal layer 204 comprises tungsten (W), aluminum (Al), and/or copper (Cu).

According to some embodiments of the invention, the cell gate patterns 130c, the LV gate patterns 130l, and the HV gate patterns 130h are connected to the metal interconnections through the second plugs 200 without the first plugs 190. The drain impurity regions 140d are connected to the metal interconnections 220 through the first and second plugs 190 and 200.

The LV and HV impurity regions, 140l and 140h, may also be connected with the metal interconnections 220 in various features. In some embodiments of the invention, the HV impurity regions 140h are connected to the metal interconnections 220 through the first and second plugs, 190 and 200, which are stacked in sequence, while the LV impurity regions 140l are connected to the metal interconnections 220 through the second plugs 200 (see FIGS. 6A, 6B, 7A, and 7B).

In further embodiments of the invention, both the LV and HV impurity regions, 140l and 140h, are connected to the metal interconnections 220 through the first and second plugs, 190 and 200, which are stacked in sequence (see FIGS. 6A, 7A, 11, and 12). In still further embodiments of the invention, both the LV and HV impurity regions, 140l and 140h, are connected to the metal interconnections 220 just through the second plug 200 (see FIGS. 6A, 7A, 15, and 16).

Further, in other embodiments of the present invention, the metal interconnections 220 may comprise the second barrier metal layer 222 and the second metal layer 224 that are stacked in sequence. The second barrier metal layer 222 comprises titanium (Ti), titanium-nitride (TiN), tungsten-nitride (WN), tantalum (Ta), and/or tantalum-nitride (TaN), while the second metal layer 224 comprises tungsten (W), aluminum (Al), and/or copper (Cu). In these embodiments, the metal interconnections 220 are covered by the inter-metal insulation layer 230. According to some embodiments of the invention, the molding layer 230' is disposed between the metal interconnections 222, and the second barrier metal layer 222 is interposed between the molding layer 230' and the second metal layer 224. In addition, the metal interconnections 220 may be formed of the second metal layer 224 without the second barrier metal layer 222.

On the other hand, as the integration density of a semiconductor device increases, the width of the contact holes 181 and 182 may decrease. However, to ensure tight electrical insulation between conductive patterns, such as a gate pattern and bitlines, the aspect ratio of the contact holes 181 and 182 may increase so that the inter-level insulation layer can have a predetermined thickness. This increase in the aspect ratio may hinder the contact holes 181 and 182 from being vertically formed. For example, when the aspect ratio of the contact holes 181 and 182 increases, the sidewalls of the contact holes 181 and 182 slope down. Thus, the contact holes 181 and 182 are wider at the top than at the bottom. In this case, a conductive contact plug, which fills the contact holes 181 and 182 with relatively wide tops, may create a short circuit with an adjacent metal interconnection 220.

Such a short circuit problem may occur when the increased width of the contact holes 181 and 182 is greater than a misalignment margin between a photolithographic process for forming the contact holes 181 and 182 and a photolithographic process for forming the metal interconnections 220. Further, cleaning operations, which may be performed after formation of the contact holes 181 and 182, may lead to a further increase in the width of the contact holes 181 and 182, which may result in another problem, such as connection between adjacent contact holes.

Methods of forming a contact plug structure, according to some embodiments of the present invention, may reduce and/or eliminate the occurrence of short circuits that arise from the increase in the width of the contact holes 181 and 182. FIGS. 18A through 18H are cross-section diagrams taken along a dotted line F-F' of FIG. 17A, which illustrate processing flows for manufacturing a contact plug structure according to some embodiments of the present invention. In these embodiments, the contact plug structure may be manufactured using the methods of forming the first and second plugs 190 and 200 as described in the aforementioned embodiments with reference to FIGS. 2 through 16.

Referring to FIGS. 18A through 18D, impurity regions 140 are formed in a semiconductor substrate 100, and an inter-level insulation layer is formed on the resultant structure where the impurity regions 140 are formed. The inter-level insulation layer comprises a lower insulation layer 160 and a higher insulation layer 180 that are deposited in sequence. The inter-level insulation layer is patterned to form a contact hole 185 that exposes the impurity region 140.

A contact hole spacer layer is formed on the resultant structure in which the contact hole 185 is completed, and the contact hole spacer layer is etched using an anisotropic etching process until the top of the impurity region 140 is exposed. Thus, a contact hole spacer 310 is formed on an inner sidewall of the contact hole 185. The contact hole spacer layer comprises a material with an etch selectivity with respect to the inter-level insulation layers 160 and 180. For example, the contact hole spacer layer may comprise silicon-nitride or silicon-oxynitride in some embodiments.

On the resultant structure where the contact hole spacer 310 is formed, a first conductive layer 195 that fills the contact hole 185 is formed and etched to form a first plug 190 with a top surface lower than a top surface of the inter-level insulation layer. The first plug 190 may be formed in the same manner as described with reference to FIGS. 4A and 4B. In other words, the process of forming the first plug 190 is carried out by recessing a top surface of the first conductive layer that is planarized by etching until the top surface of the inter-level insulation layer is exposed.

Referring to FIGS. 18E through 18H, a higher spacer layer is formed on the entire surface of the resultant structure where the first plug 190 is completed, and the higher spacer layer is anisotropically etched until the top surface of the first plug 190 is exposed. Thus, a higher spacer 330 is formed on a top portion of the inner sidewall of the contact hole 185 on which the contact hole spacer 310 is laid. As a result, the top width of the contact hole 185 is reduced due to the contact hole spacer 310 and the higher spacer 330. A reduction in the top width of the contact hole 185 is dependent on the thickness of the contact hole spacer 310 and the thickness of the higher spacer 330. Especially, the reduction in the top width of the contact hole 185 is dependent on the deposited thickness of the higher spacer layer (namely, the width of the higher spacer 330). This reduction in the top width of the contact hole 185 can prevent or reduce the possibility of short circuits arising from an increase in the width of a contact hole.

Subsequently, the contact hole 185 in which the higher spacer 330 is formed is filled with a second plug 200. In some embodiments, the first plug 190 may comprise polycrystalline silicon, and the second plug 200 may comprise a first barrier metal layer 202 and a first metal layer 204 that are stacked in sequence. The first barrier metal layer 202 comprises titanium (Ti), titanium-nitride (TiN), tungsten-nitride (WN), tantalum (Ta), and/or tantalum-nitride (TaN), while the first metal layer 204 comprises tungsten (W), aluminum (Al), and/or copper (Cu). In these embodiments, the second plug 200 may be formed in the same manner as described with reference to FIGS. 5A and 5B.

In other embodiments, both the first and second plugs 190 and 200 may comprise polycrystalline silicon. In this case, the second plug 200 may comprise polycrystalline silicon without the first barrier metal layer 202.

A third conductive layer is formed on the resultant structure where the second plugs 200 are formed. Afterwards, the third conductive layer is patterned to form metal interconnections 220 connected to the tops of the second plugs 200. The third conductive layer may comprise a second barrier metal layer 222 and a second metal layer 224 that are stacked in sequence. The metal interconnections 220 may be obtained in the same manner as described with reference to FIGS. 6A and 6B.

FIGS. 19A and 19B are a cross-sectional diagrams that illustrate a process flow for forming a contact hole spacer shown in FIGS. 18A through 18H in accordance with some embodiments of the present invention.

Referring to FIGS. 19A and 19B, the contact hole spacer 310 may be thicker in a higher portion than in a lower portion thereof. For this, the contact hole spacer layer 300 may be formed to a greater thickness in an upper region of the contact hole 185 than in a lower region thereof, which can be obtained by controlling process conditions, such as process temperature, pressure, and gas flow rate, in a deposition operation.

By forming the contact hole spacer 310 to be thicker in the upper region of the contact hole 185, the top width of the contact hole 185 can be reduced more effectively. This reduction in the top width of the contact hole 185 may be advantageous in reducing and/or preventing the occurrence of short circuits as described above.

FIGS. 20A through 20H are cross-sectional diagrams that illustrate processing flows for manufacturing a contact plug structure according to other embodiments of the present invention. These embodiments are the same as the embodiments described with reference to FIGS. 18A through 18H except that the process of forming the contact hole spacer 310 is omitted. These embodiments may be applied to a case where the top width of the contact hole 185 is not excessively expanded, and may solve the problem of short circuits by means of fewer process operations than the aforementioned embodiments.

Figure 21A:
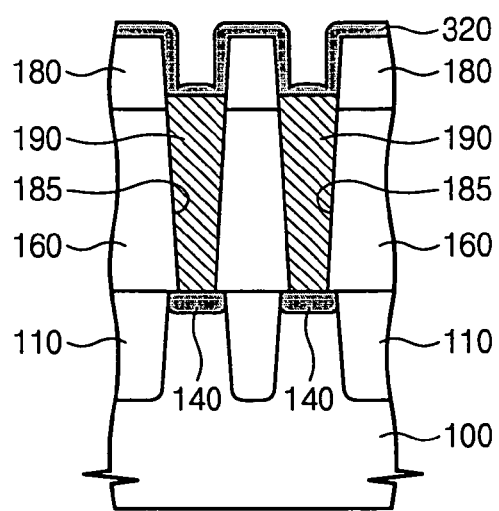
FIGS. 21A and 21B are a cross-section diagram that illustrate a process flow for forming a contact hole spacer shown in FIGS. 20A through 20H.
Figure 21B:
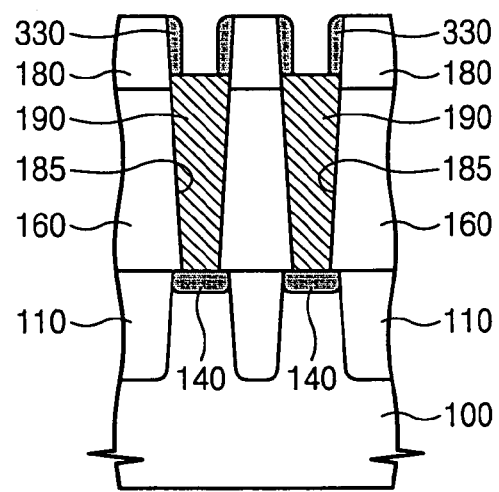

Like the contact hole spacer 310 described with reference to FIGS. 19A and 19B, the higher spacer 330 may also be thicker in an upper region than in a lower region. More specifically, process conditions are controlled during a process of forming the higher spacer layer 320 as shown in FIGS. 21A and 21B, so that the deposited thickness of the higher spacer layer 320 can vary with the position of the higher spacer layer 320 in the contact hole 185. Preferably, process temperature, pressure, and gas flow rate are controlled such that the higher spacer 320 has relatively poor step coverage as shown in FIGS. 21A and 21B. The method for controlling the deposited thickness of the higher spacer 330 may also be applied to the embodiments described with reference to FIGS. 18A through 18H.

The techniques for controlling short circuits arising from an increase in the width of a contact hole by use of the contact hole spacer 310 or the higher spacer 330 may be applied to the embodiments described with reference to FIGS. 2 through 16. FIGS. 22 through 26 are diagrams that illustrate semiconductor devices including contact plug structures with the contact hole spacer 310 or the higher spacer 330 according to some embodiments of the present invention.

Figure 22A:
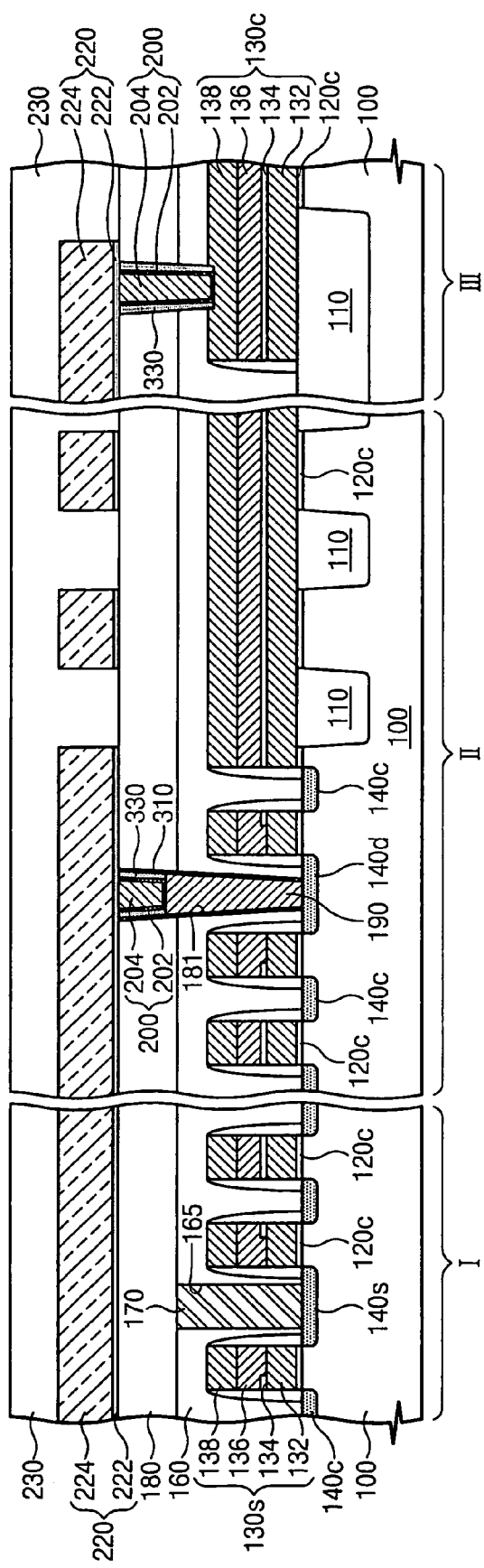
FIGS. 22A and 22B are cross-section diagrams that illustrate process flows for manufacturing a semiconductor device according to still other embodiments of the present invention.
Figure 22B:
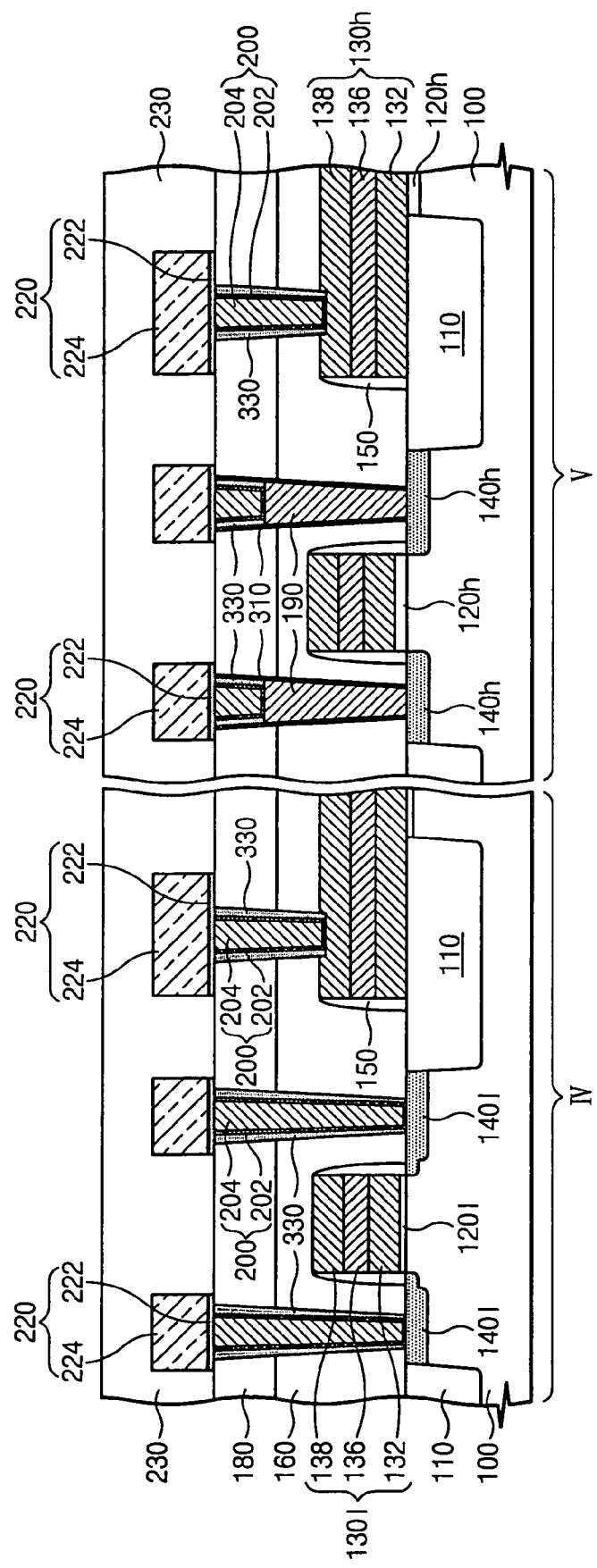
Figure 23A:
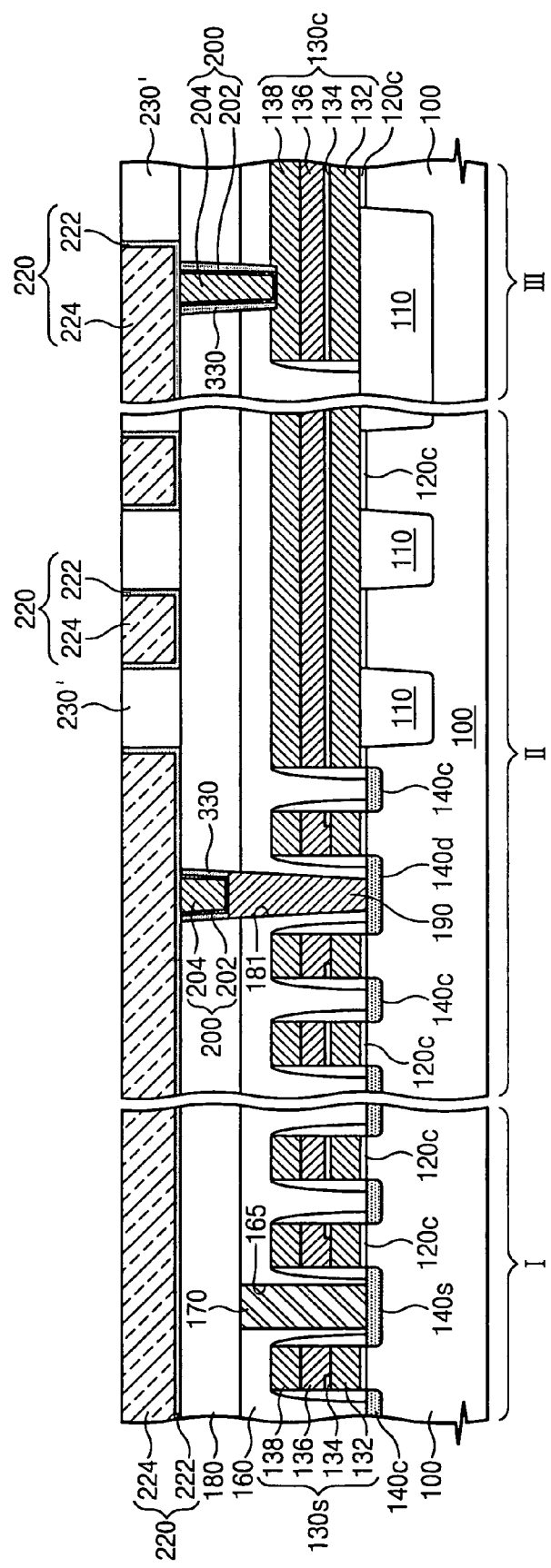
FIGS. 23A and 23B are cross-section diagrams that illustrate process flows for manufacturing a semiconductor device according to further embodiments of the present invention.
Figure 23B:
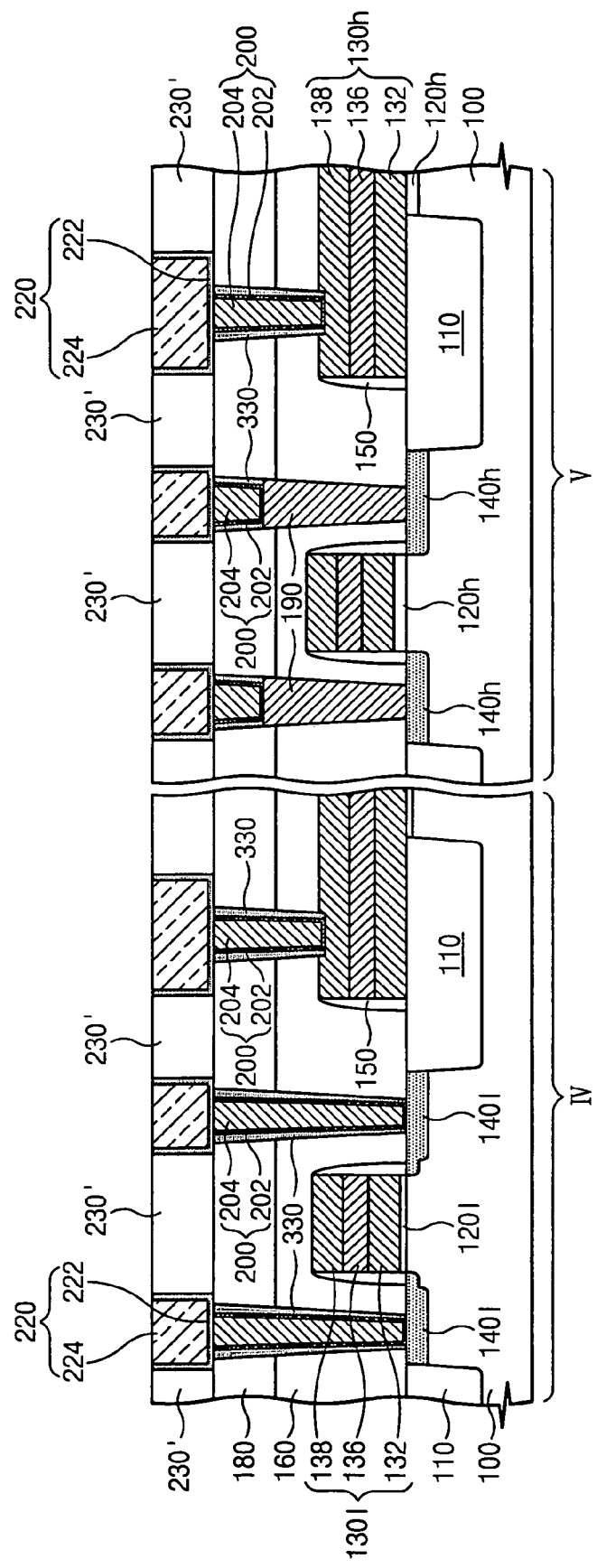
Figure 24:
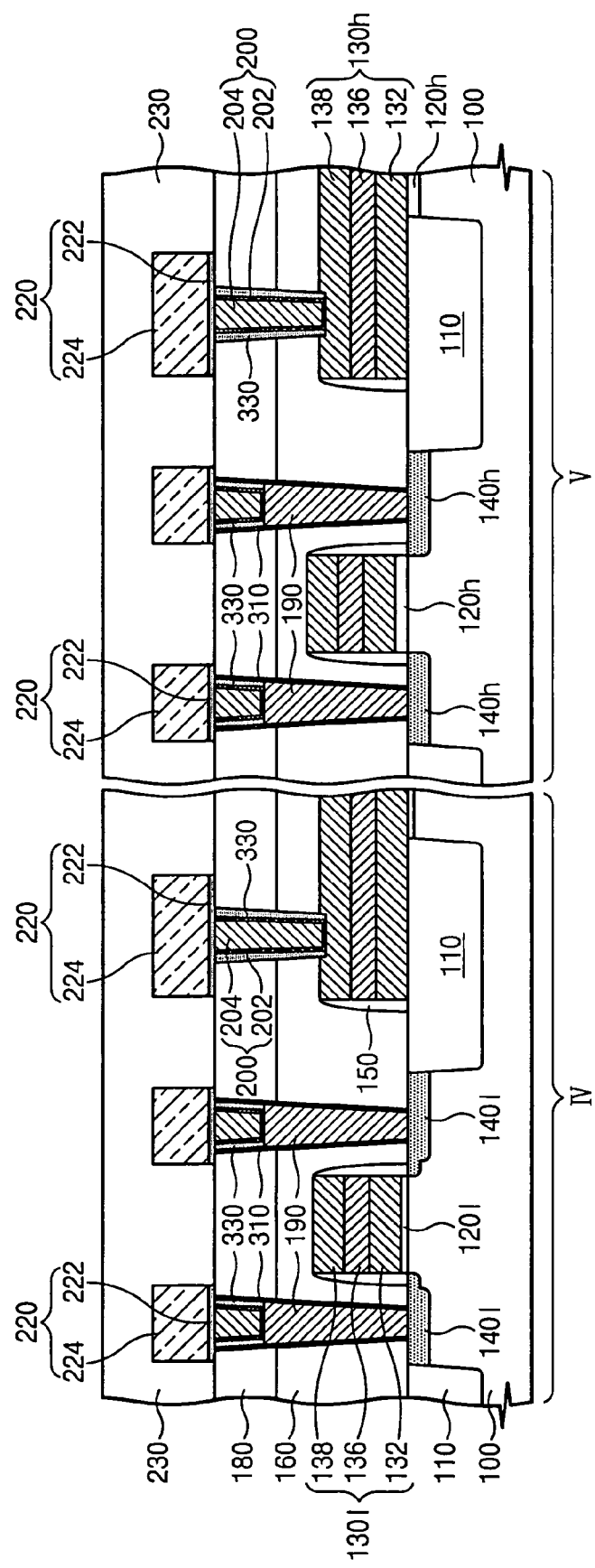
FIGS. 24 through 26 are cross-section diagrams that illustrate process flows for manufacturing a semiconductor device according to still other embodiments of the present invention.
Figure 25:
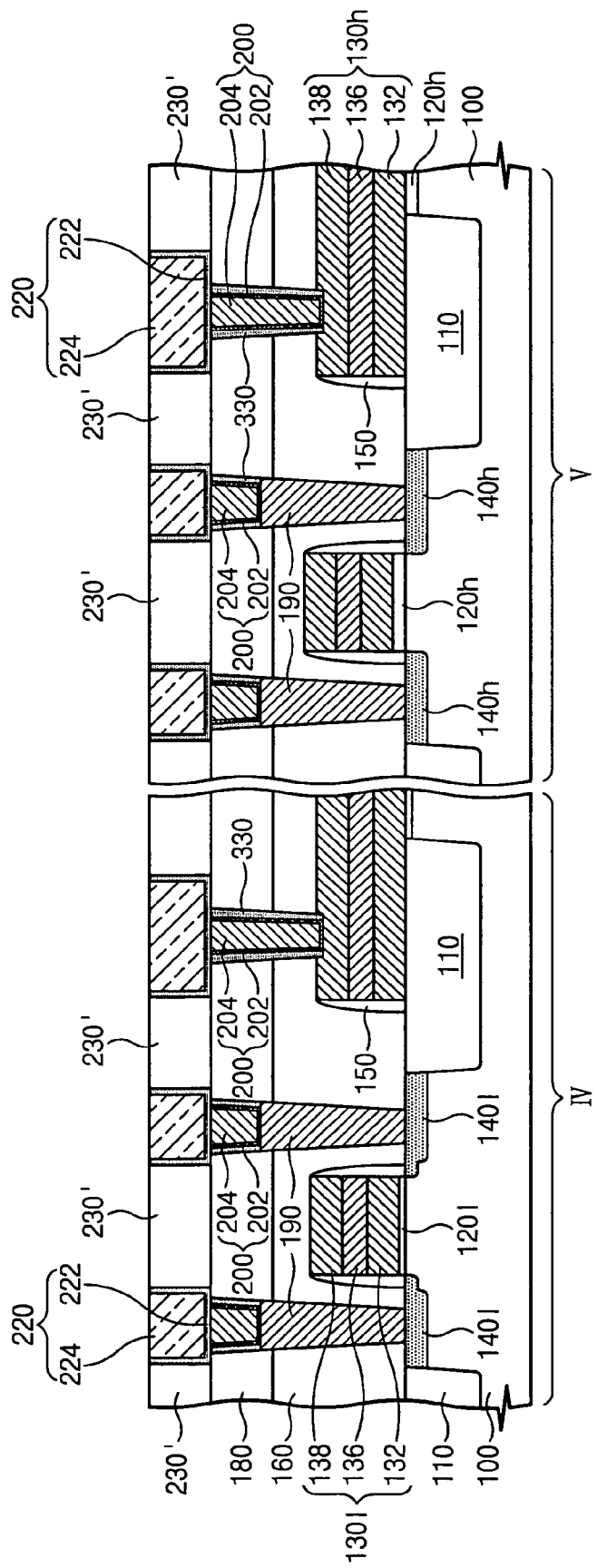
Figure 26:
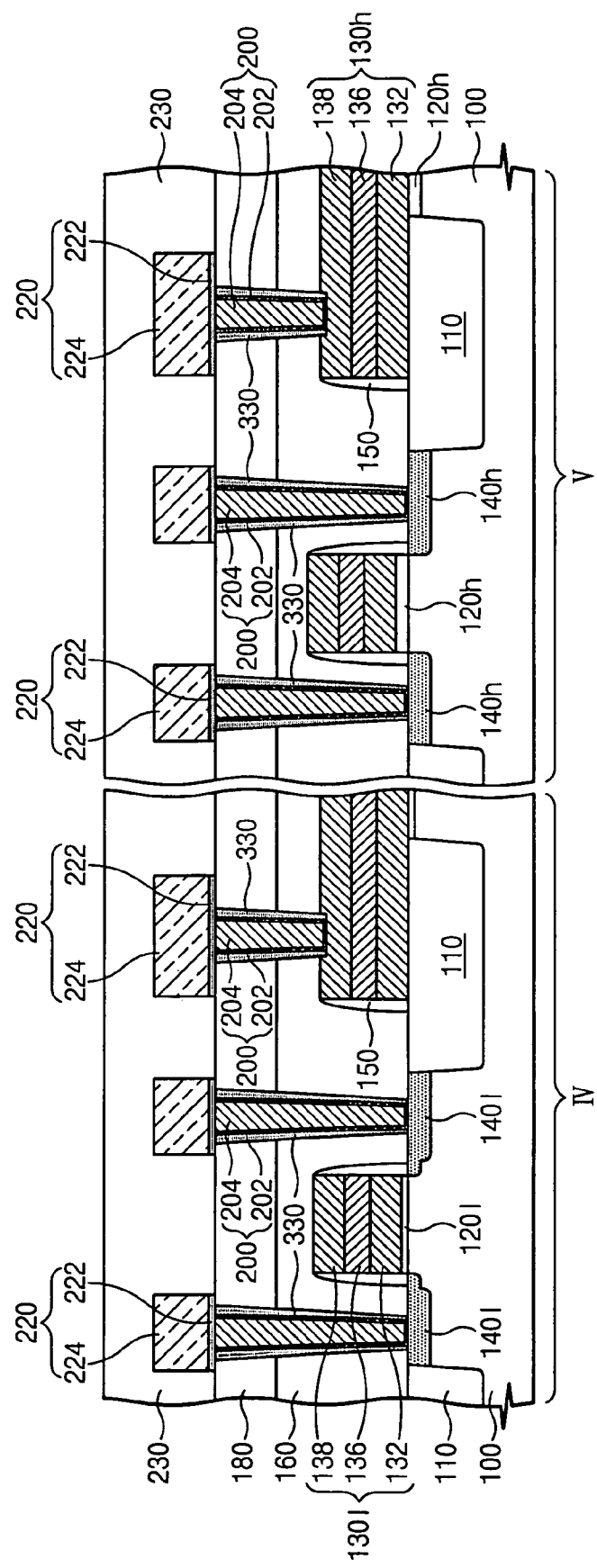

More specifically, FIGS. 22A and 22B are cross-sectional diagrams that illustrate process flows for manufacturing a semiconductor device according to other embodiments of the present invention. FIGS. 23A and 23B are cross-section diagrams that illustrate process flows for manufacturing a semiconductor device according to further embodiments of the present invention. FIGS. 24 through 26 are cross-section diagrams that illustrate process flows for manufacturing a semiconductor device according to various still further embodiments of the present invention. In FIGS. 22A and 23A, domains I, II, and III are cross-sections taken along dotted lines A-A', B-B', and C-C' of FIG. 17A, respectively. In FIGS. 22B and 23B and in FIGS. 24 through 26, domains IV and V are cross-sections taken along dotted lines D-D' and E-E' of FIGS. 17B and 17C, respectively.

In some embodiments of the present invention, the drain impurity regions 140d are connected to the metal interconnections 220 by the first and second plugs, 190 and 200, which are stacked in sequence. An upper spacer 330 and a contact hole spacer 310 are interposed between the second plug 200 and the inter-level insulation layer, while the contact hole spacer 310 is interposed between the first plug 190 and the inter-level insulation layer (refer to FIGS. 22A and 23A).

The cell gate patterns 130c, the LV gate patterns 130l, and the HV gate patterns 130h are connected to the metal interconnections 220 by the second plug 200 without the first plug 190. The higher spacer 330 is interposed between the second plug 200 and the inter-level insulation layer (refer to FIGS. 22A, 22B, 23A, and 23B).

On the other hand, the LV and HV impurity regions, 140l and 140h, may be connected with the metal interconnections 220 in various embodiments. For example, as shown in FIG. 22B, the LV impurity regions 140l may be connected to the metal interconnections 220 by the second plug 200 without the first plug 190, while the HV impurity regions 140h may be connected to the metal interconnections 220 by the first and second plugs, 190 and 200. Because the contact hole spacer 310 is disposed on an outer wall of the first plug 190, the higher spacer 330, without the contact hole spacer 310, is disposed over the LV impurity region 140l that does not include the first plug 190. However, both the higher spacer 330 and the contact hole spacer 310 are disposed over the HV impurity region 140h.

In some embodiments, the contact hole spacer 310 may not be disposed in the HV impurity region 140h as shown in FIG. 23B. These embodiments in which the contact hole spacer 310 is not formed may be applied to a case where a contact hole is not excessively expanded during an etching process or a cleaning process. When diffusion of impurities from the first plug 190 does not cause any technical problems, an increase in the width of the contact hole may be effectively prevented by the higher spacer 330. These embodiments can reduce the number of process operations as compared with the embodiments described with reference to FIGS. 22A and 22B.

In further embodiments, the LV and HV impurity regions, 140l and 140h, are connected to the metal interconnections 220 by the first and second plugs, 190 and 200. The first plug 190 contacts an inner wall of the inter-level insulation layer, and a higher spacer 330 is interposed between the second plug 200 and the inter-level insulation layer (see FIG.24). Alternatively, the higher spacer 330 and the contact hole spacer 310 are interposed between the second plug 200 and the inter-level insulation layer, and the contact hole spacer 310 is interposed between the first plug 190 and the inter-level insulation layer (see FIG. 25).

In still further embodiments, the LV and HV impurity regions, 140l and 140h, are connected to the metal interconnections 220 through the second plug 200. The high spacer 330, without the contact hole spacer 310, is interposed between the second plug 200 and the inter-level insulation layer (see FIG. 26).

From the embodiments of the present invention described above, it can be seen that the metal interconnections directly contact the second plugs made of a metallic material, without contacting the first plugs. Therefore, the barrier metal layer may have a thickness less than the critical thickness or the metal interconnections may be formed without the barrier metal layer. As a result, some embodiments of the present invention may be useful for manufacturing a high-frequency semiconductor device because they inhibit increases in the sheet resistance of the metal interconnections.

In addition, even when the metal connections are shaped by patterning with an anisotropic etching process, the second plugs of metal can be etched together. Thus, conventional problems, such as short circuits between plugs and interconnections or an increase of resistance therein, can be reduced. Because the manufacturing processes of the invention are applicable without additional photolithographic steps relative to the conventional methods, improved devices may be obtained without increasing costs.

Furthermore, the higher spacer is disposed on the top sidewall of the contact hole. By reducing an effective opening area of the contact hole using the higher spacer, unintentional electrical connection (i.e., a short circuit) between the contact plug and the metal interconnections can be inhibited. The inhibition of the short circuit leads to improvements in the yield and reliability of semiconductor devices.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. An interconnection structure for a semiconductor device, comprising:
    an inter-level insulation layer disposed on a semiconductor substrate;
    a contact hole in the inter-level insulation layer;
    a first contact plug disposed in a lower portion of the contact hole adjacent to the semiconductor substrate;
    a spacer disposed locally on a sidewall of an upper portion of the contact hole opposite the semiconductor substrate to expose a top surface of the first contact plus, the upper and lower portions of the contact hole having no overlap therebetween;
    a second contact plug disposed on the first contact plug in the upper portion of the contact hole; and
    a conductive interconnection connected to the second contact plug.

2. The interconnection structure of claim 1, wherein the spacer is a first spacer, the interconnection structure further comprising:
    a second spacer disposed between the first contact plug and the sidewall of the contact hole and between the first spacer and the sidewall of the contact hole.

3. The interconnection structure of claim 2, wherein the second spacer comprises silicon-nitride.

4. The interconnection structure of claim 2, wherein a first portion of the second spacer disposed between the first spacer and the sidewall of the contact hole is thicker than a second portion of the second spacer disposed between the first contact plug and the sidewall of the contact hole.

5. The interconnection structure of claim 1, further comprising:
    gate patterns interposed between the inter-level insulation layer and the semiconductor substrate, the gate patterns being connected to the conductive interconnection by the second contact plug.

6. The interconnection structure of claim 1, wherein the first contact plug comprises polycrystalline silicon (polysilicon);
    wherein the second contact plug comprises a first barrier metal layer and a first metal layer, which are stacked in sequence, the first barrier metal layer comprising titanium, titanium-nitride, tungsten-nitride, tantalum, and/or tantalum-nitride, the first metal layer comprising tungsten, aluminum, and/or copper; and
    wherein the conductive interconnection comprises a second barrier metal layer and a second metal layer, which are stacked in sequence, the second barrier metal layer comprising titanium, titanium-nitride, tungsten-nitride, tantalum, and/or tantalum-nitride, the second metal layer comprising tungsten, aluminum, and/or copper.

7. The interconnection structure of claim 1, wherein the first and second contact plugs comprise polycrystalline silicon (polysilicon).

8. The interconnection structure of claim 1, wherein the semiconductor substrate comprises a cell array region where cell transistors are arranged with cell impurity regions and cell gate patterns, a low voltage region where low voltage transistors are arranged with low voltage impurity regions and low voltage gate patterns, and a high voltage region where high voltage transistors are arranged with high voltage impurity regions and high voltage gate patterns;
    wherein the contact hole is a first contact hole, the spacer is a first spacer, and the first contact plug, the first spacer, and the second contact plug comprises a first contact structure;

wherein the interconnection structure further comprises a second contact structure comprising:
- a second contact hole in the inter-level insulation layer;
- a second contact plug disposed in the second contact hole;
- a second spacer disposed between the second contact plug and the sidewall of the second contact hole;

wherein a part of the cell impurity regions is connected to the first contact structure, and the cell gate patterns, the low voltage gate patterns, and the high voltage gate patterns are connected to the second contact structure.

9. The interconnection structure of claim 8, wherein the low voltage impurity region is connected to one of the first and second contact structures and the high voltage impurity region is connected to one of the first and second contact structures.

10. The interconnection structure of claim 8, wherein the cell gate patterns comprise a floating gate electrode, a gate inter-level insulation layer, and a control gate electrode, which are stacked in sequence, and the conductive interconnection connected to the first contact structure is a bitline.

11. The interconnection structure of claim 1, wherein a shape of the spacer is a ring or an open cylinder.

12. The interconnection structure of claim 1, wherein the spacer comprises an insulating material to narrow an effective sectional area of the contact hole.

* * * * *